United States Patent
Hirose et al.

(10) Patent No.: US 7,479,908 B2
(45) Date of Patent: Jan. 20, 2009

(54) SEMICONDUCTOR DEVICE INCLUDING A/D CONVERTER

(75) Inventors: Masaya Hirose, Kyoto (JP); Kinya Daio, Kyoto (JP); Tetsuya Oosaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/806,552

(22) Filed: Jun. 1, 2007

(65) Prior Publication Data
US 2008/0007439 A1  Jan. 10, 2008

(30) Foreign Application Priority Data
Jul. 4, 2006  (JP) .............................. 2006-184332

(51) Int. Cl.
*H03M 1/10* (2006.01)
(52) U.S. Cl. ..................................... 341/120
(58) Field of Classification Search ................. 341/118, 341/119, 155, 120, 161, 165
See application file for complete search history.

(56) References Cited

U.S. PATENT DOCUMENTS 6,211,803 B1   4/2001  Sunter
2006/0077081 A1*  4/2006  Bock .......................... 341/118

FOREIGN PATENT DOCUMENTS

JP  2001-166013  6/2001

\* cited by examiner

*Primary Examiner*—Jean B Jeanglaude
(74) *Attorney, Agent, or Firm*—McDermott Will & Emery LLP

(57) ABSTRACT

A semiconductor device includes: an A/D converter; a digital processing circuit for performing processing based on conversion results from the A/D converter; a first test circuit for performing operation processing for checking a nonlinearity error (INLE) of the conversion results from the A/D converter; and a second test circuit for performing operation processing for checking a differential nonlinearity error (DNLE) of the conversion results from the A/D converter. The first test circuit performs only part of the operation processing for checking the nonlinearity error (INLE) of the conversion results from the A/D converter. The second test circuit performs only part of the operation processing for checking the differential nonlinearity error (DNLE) of the conversion results from the A/D converter. An operation processing section for performing the rest of the operation processing for checking the nonlinearity error (INLE) and the rest of the operation processing for checking the differential nonlinearity error (DNLE) is in a semiconductor test device.

29 Claims, 22 Drawing Sheets

PRIOR ART

SEMICONDUCTOR DEVICE INCLUDING A/D CONVERTER

CROSS-REFERENCE TO RELATED APPLICATION

This Non-provisional application claims priority under 35 U.S.C. § 119(a) on Patent Application No. 2006-184332 filed in Japan on Jul. 4, 2006, the entire contents of which are hereby incorporated by reference.

BACKGROUND OF THE INVENTION

1. Field of the Invention

The present invention relates to a semiconductor device including an A/D converter, and particularly relates to a semiconductor device capable of testing an internal A/D converter by making the A/D converter output conversion results externally.

2. Description of the Related Art

In recent years, semiconductor devices which are so-called system-on-chips, where, for example, an A/D converter, a digital circuit for performing processing based on conversion results from the A/D converter, etc. are integrated on a single chip, have become mainstream. In some of such A/D-converter-including semiconductor devices, a mode-switching circuit is included to allow A/D conversion results to be externally output directly through a digital buffer, so that the A/D converter can be tested singly.

However, even in a semiconductor device in which highly precise A/D conversion is performed when the device is actually used, if, during a test, the influence of power supply voltage variation and of noise, occurring due to the driving of a relatively heavily-loaded test device (e.g., an LSI tester) by the digital buffer, is increased, the accuracy of the A/D conversion decreases, which may cause the test to be performed incorrectly.

In view of this, a technique has been proposed, in which a storage means is provided in a semiconductor device (e.g., an LSI) to allow high-frequency data output from the A/D converter to be temporarily stored in the semiconductor device, and, after the completion of A/D conversion, the data is read externally of the semiconductor device, whereby the influence of noise is reduced to thereby increase the accuracy of testing (see Japanese Laid-Open Publication No. 2001-166013, for example).

SUMMARY OF THE INVENTION

Nevertheless, since the number of bits of the resolution of recently fabricated A/D converters has been increasing (equal to or higher than 12 to 14 bits), enormous amounts of digital output results are necessary to test the A/D converter. In the case where the conventional storage means is provided for the temporary storage of the entire data output from the A/D converter in the semiconductor device, the amount of time required to read the A/D conversion results from the storage means and the amount of time required to perform operations on the A/D conversion results are increased, resulting in an increase in the test cost.

An inventive semiconductor device includes: an A/D converter; a digital processing circuit for performing processing based on conversion results from the A/D converter; a first test circuit for performing operation processing for checking a nonlinearity error (INLE) of the conversion results from the A/D converter; and a second test circuit for performing operation processing for checking a differential nonlinearity error (DNLE) of the conversion results from the A/D converter, wherein the first test circuit performs only part of the operation processing for checking the nonlinearity error (INLE) of the conversion results from the A/D converter; the second test circuit performs only part of the operation processing for checking the differential nonlinearity error (DNLE) of the conversion results from the A/D converter; and an operation processing section for performing the rest of the operation processing for checking the nonlinearity error (INLE) and the rest of the operation processing for checking the differential nonlinearity error (DNLE) is in a semiconductor test device.

According to the present invention, the influence of power supply voltage variation and of noise occurring when A/D conversion results are output is avoided to easily perform an appropriate test on the A/D converter, while operation processing on the massive amounts of digital output results that are required for the test on the A/D converter due to the increasing number of bits of the resolution of the A/D converter is efficiently performed in the semiconductor device to reduce the volume of data on the A/D conversion results that is read externally of the semiconductor device and hence the amount of operations performed outside the semiconductor device, thereby easily reducing the test time, i.e., the test costs.

DETAILED DESCRIPTION OF THE INVENTION

Figure 1:
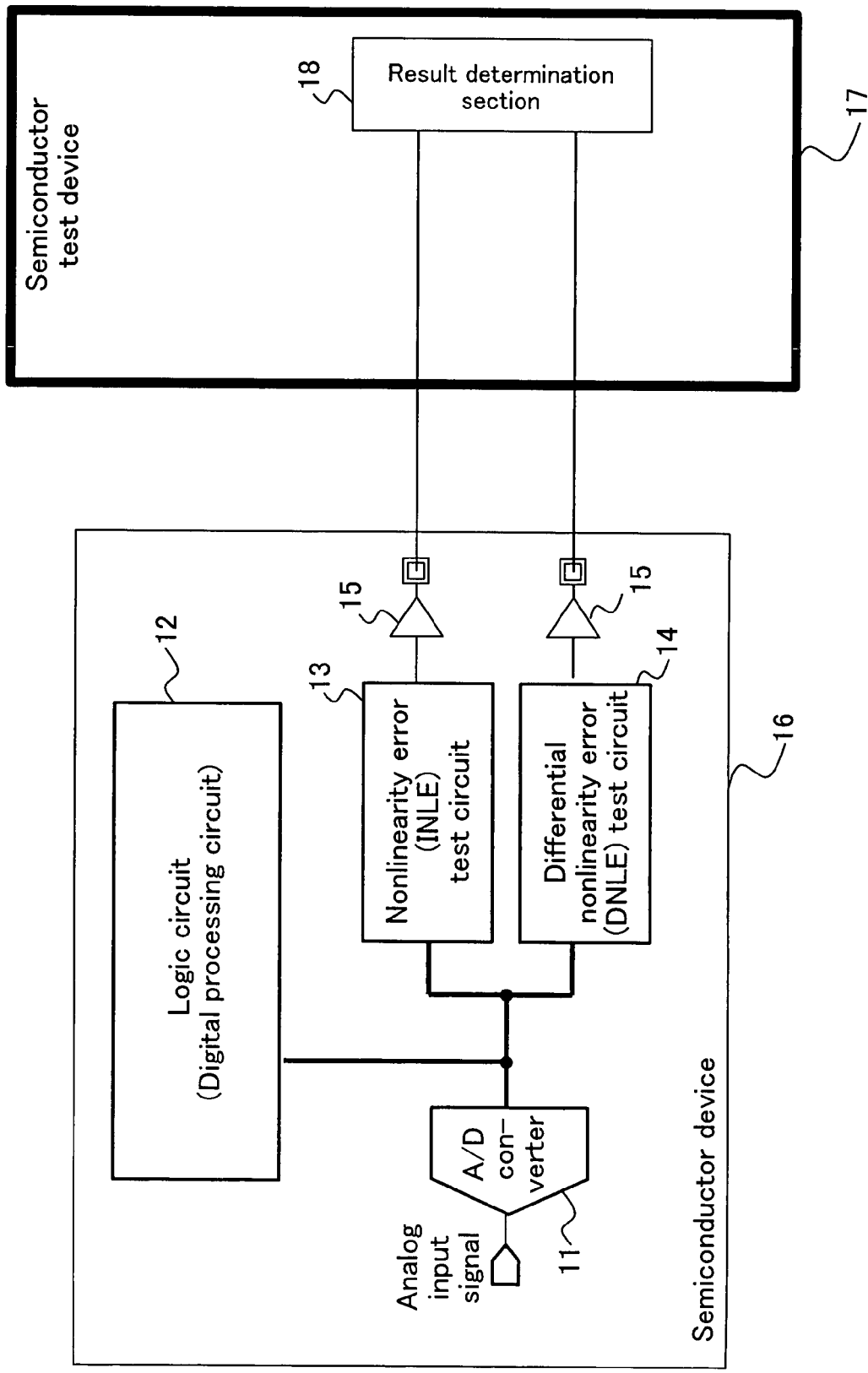
FIG. 1 is a block diagram illustrating the structure of a semiconductor device according to a first embodiment.

Hereinafter, embodiments of the present invention will be described in detail with reference to the accompanying drawings. In the drawings, components that have substantially the same functions are denoted by the same reference numerals, and description thereof will not be repeated.

First Embodiment

FIG. 1 illustrates the structure of a semiconductor device according to a first embodiment. The semiconductor device 16 includes an A/D converter 11, a digital processing circuit 12, a nonlinearity error (INLE) test circuit 13, a differential nonlinearity error (DNLE) test circuit 14, and buffers 15. The A/D converter 11 converts an analog input signal, which is input within or outside from the semiconductor device 16, to a digital signal. The digital processing circuit 12 performs certain processing by using conversion results obtained by the A/D converter 11 (in FIG. 1, only one bit of the output of the A/D converter 11 is described as a representative example). The nonlinearity error (INLE) test circuit 13 receives the conversion results obtained by the A/D converter 11, performs an operation for calculating a nonlinearity error (INLE) value, and outputs the operation result to a result determination section 18 in a semiconductor test device 17. The differential nonlinearity error (DNLE) test circuit 14 receives the conversion results obtained by the A/D converter 11, performs an operation for calculating a differential nonlinearity error (DNLE) value, and outputs the operation result to the result determination section 18 in the semiconductor test device 17.

In the semiconductor device 16 thus structured, during normal operation, the digital processing circuit 12 is enabled, while the nonlinearity error (INLE) test circuit 13 and the differential nonlinearity error (DNLE) test circuit 14 are disabled. On the other hand, during testing on the semiconductor device 16, for example, a predetermined voltage, as an analog input signal, is applied outside from the semiconductor device 16, and the nonlinearity error (INLE) test circuit 13 and the differential nonlinearity error (DNLE) test circuit 14 are enabled, while the digital processing circuit 12 is disabled.

Now, the semiconductor device 16 according to the first embodiment will be described by comparing the semiconductor device 16 with a conventional example (disclosed in claim 2 in Japanese Laid-Open Publication No. 2001-166013).

Figure 21:
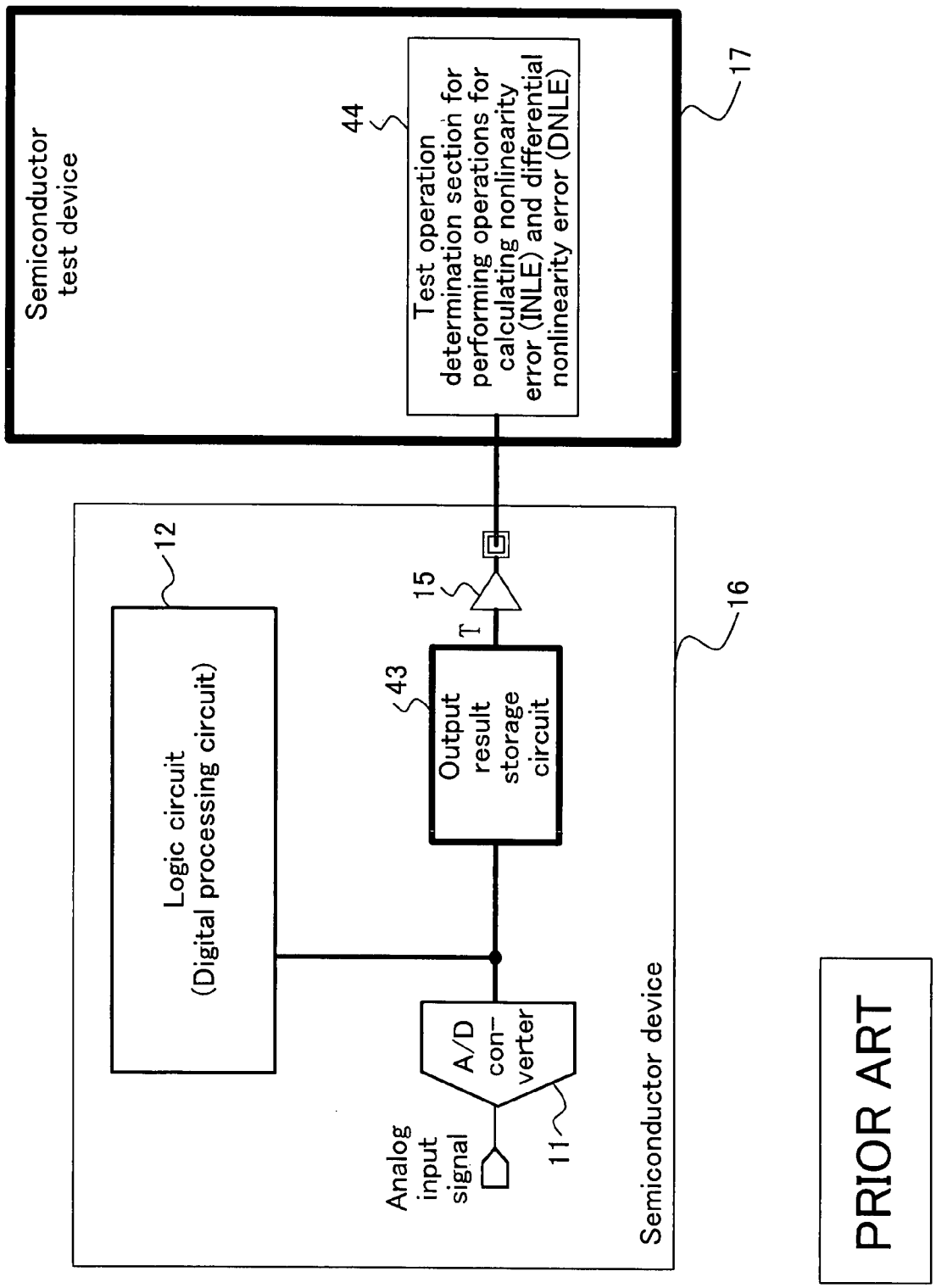
FIG. 21 is a block diagram illustrating the structure of a conventional semiconductor device.

The conventional example shown in FIG. 21 is intended to avoid a situation in which due to the driving, by a buffer 15, of a relatively heavy load (e.g., about ten times the capacitance of an input load in a semiconductor device 16), such as a test device 17, power supply voltage variation, and noise superposition on an A/D converter 11 through parasitic capacitances existing within or outside the semiconductor device 16 become relatively large as compared with those variation and noise superposition occurring during normal operation. Specifically, according to the technique in the conventional example, data is temporarily stored in an output result storage circuit 43 and the stored data is read separately, thereby avoiding noise superposition on the A/D converter 11 and the like.

However, if the number of bits (of resolution) of the A/D converter 11 is increased (e.g., equal to or higher than about 12 to 14 bits), the amount of conversion results to be stored in the output result storage circuit 43 and hence the capacitance of the output result storage circuit 43 become huge, causing a disadvantage in that the time required to read the data into the semiconductor test device 17 and the time required for a test operation determination section 44 in the semiconductor test device 17 to perform operations for calculating an nonlinearity error (INLE) and a differential nonlinearity error (DNLE) are increased.

This disadvantage is caused, because the output results from the A/D converter 11 that completely satisfy data required for the nonlinearity error (INLE) value calculation operation and data required for the differential nonlinearity error (DNLE) value calculation operation are all read into the semiconductor test device 17, so that all of the operations are performed in the semiconductor test device 17.

The present inventors have focused on the fact that, in the semiconductor device 16 according to the first embodiment, data required for the nonlinearity error (INLE) value calculation operation is only digital output results that the A/D converter 11 produces for respective analog input values, and data required for the differential nonlinearity error (DNLE) value calculation operation is only occurrence frequencies (histogram) for the respective digital output codes from the A/D converter 11. The present inventors thus have employed a technique in which the nonlinearity error (INLE) test circuit 13 and the differential nonlinearity error (DNLE) test circuit 14 each separately perform an operation on the results of A/D conversion. This technique permits the nonlinearity error (INLE) test circuit 13 and the differential nonlinearity error (DNLE) test circuit 14 to be constructed by simple circuits. Furthermore, since only the operation results are output to the semiconductor test device 17, the length of time required to read the data into the semiconductor test device 17 and hence the length of time required for operation and determination in the semiconductor test device 17 are reduced.

As described above, the nonlinearity error (INLE) test circuit 13 and the differential nonlinearity error (DNLE) test circuit 14 each separately perform an operation on the results of A/D conversion, and only the operation results are output to the semiconductor test device 17, whereby it is possible to easily prevent a decrease in conversion accuracy caused by the driving of a heavy load, such as the test device, and it is also possible to simplify the structure of the test circuitry for testing the A/D converter 11.

It should be noted that in order to complete the test in a short time, the same analog input signal may be used so as to make the nonlinearity error (INLE) test circuit 13 and the differential nonlinearity error (DNLE) test circuit 14 simultaneously perform their operations.

Alternatively, in order to increase the accuracy of the test, analog input signals optimized for the nonlinearity error (INLE) test and the differential nonlinearity error (DNLE) test, respectively, may be used, so that the nonlinearity error (INLE) test circuit 13 and the differential nonlinearity error (DNLE) test circuit 14 perform their respective calculation operations during different operation periods.

Moreover, in FIG. 1, the output terminal for outputting the digital output signal is illustrated as a dedicated output terminal, but in order to reduce the number of terminals, the same terminal may be used as the output of the digital processing circuit 12 and also as the output terminal for the digital output signal. Furthermore, the input terminal for inputting the analog input signal may also be used as an input/output terminal for other signals.

Second Embodiment

Figure 2:
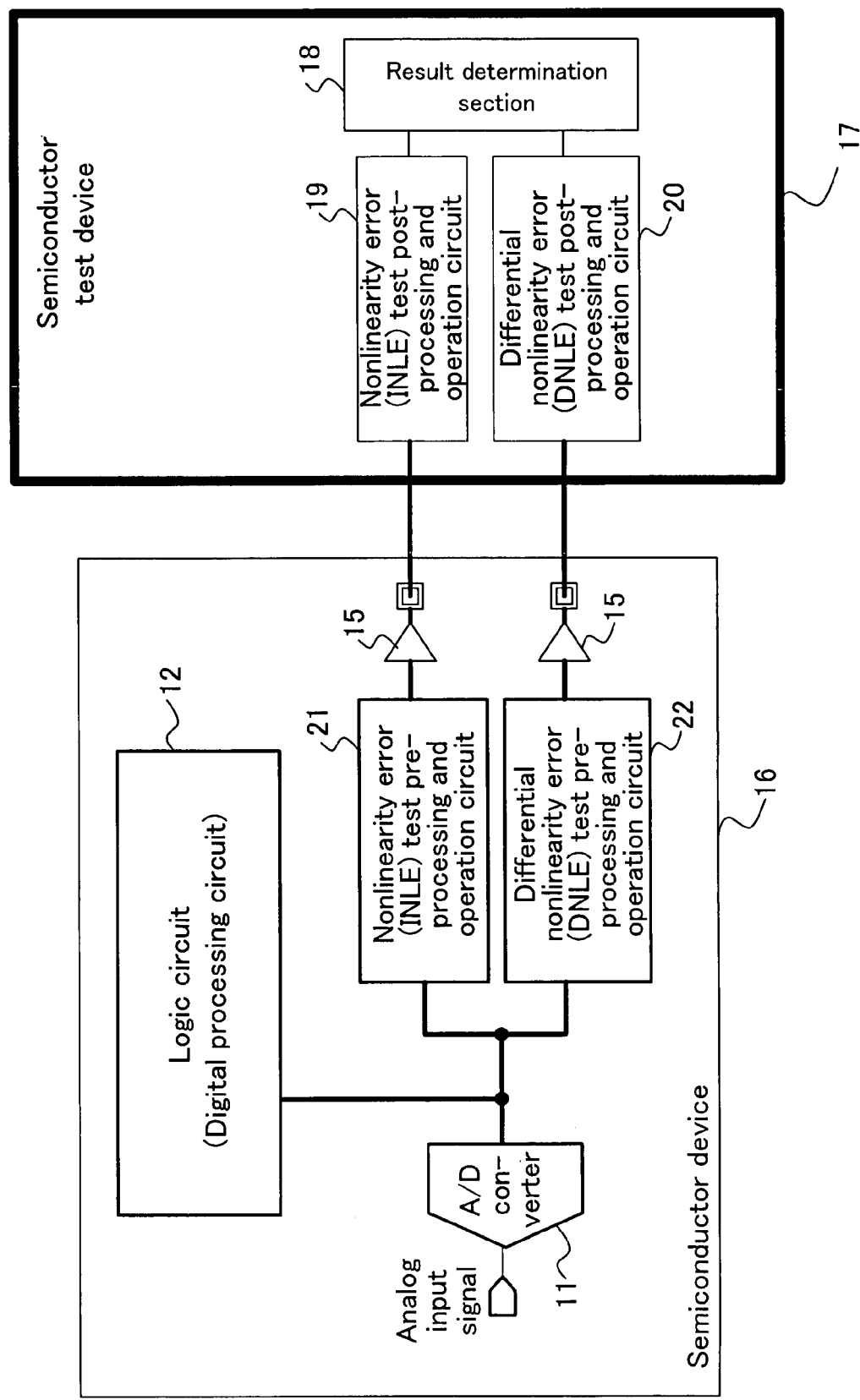
FIG. 2 is a block diagram illustrating the structure of a semiconductor device according to a second embodiment.

As shown in FIG. 2, a semiconductor device according to a second embodiment includes an A/D converter 11, a digital processing circuit 12, a nonlinearity error (INLE) test pre-processing and operation circuit 21, a differential nonlinearity error (DNLE) test pre-processing and operation circuit 22, and buffers 15. The A/D converter 11 and the digital processing circuit 12 are the same as those in the first embodiment.

The nonlinearity error (INLE) test pre-processing and operation circuit 21 receives conversion results obtained by the A/D converter 11, performs part of an operation for calculating a nonlinearity error (INLE) value, and outputs the operation result to a nonlinearity error (INLE) test post-processing and operation circuit 19 in a semiconductor test device 17. The differential nonlinearity error (DNLE) test pre-processing and operation circuit 22 receives the conversion results obtained by the A/D converter 11, performs part of an operation for calculating a differential nonlinearity error (DNLE) value, and outputs the operation result to a differential nonlinearity error (DNLE) test post-processing and operation circuit 20.

In the semiconductor device 16 thus structured, during normal operation, the digital processing circuit 12 is enabled, while the nonlinearity error (INLE) test pre-processing and operation circuit 21 and the differential nonlinearity error (DNLE) test pre-processing and operation circuit 22 are disabled. On the other hand, during testing on the semiconductor device 16, for example, a predetermined voltage, as an analog input signal, is applied outside from the semiconductor device 16, and the nonlinearity error (INLE) test pre-processing and operation circuit 21 and the differential nonlinearity error (DNLE) test pre-processing and operation circuit 22 are enabled, while the digital processing circuit 12 is disabled.

In the structure of the first embodiment, the test circuits 13 and 14 for performing the nonlinearity error (INLE) value calculation operation and the differential nonlinearity error (DNLE) value calculation operation are all included. The semiconductor device 16 of the second embodiment, however, has the structure in which, the circuits for performing parts of these operations are included in the semiconductor device 16, and the circuits for performing the rest of the operations are included in the semiconductor test device 17.

An example of the reasons for this structure is as follows. In a typical semiconductor device (LSI), circuits for performing additions and subtractions can be constructed as relatively small-sized circuits, but circuits for multiplications and divisions are likely to be increased in circuit size. Thus, the circuit size, the length of time during which testing is carried out, and the accuracy of testing can be optimized by separating the operations performed in the semiconductor device 16 and the operations performed in the semiconductor test device 17.

It should be noted that in order to complete the test in a short time, the same analog input signal may be used so as to make the nonlinearity error (INLE) test pre-processing and operation circuit 21 and the differential nonlinearity error (DNLE) test pre-processing and operation circuit 22 simultaneously perform their operations.

Alternatively, in order to increase the accuracy of the test, analog input signals optimized for the nonlinearity error (INLE) test and the differential nonlinearity error (DNLE) test, respectively, may be used, so that the nonlinearity error (INLE) test pre-processing and operation circuit 21 and the differential nonlinearity error (DNLE) test pre-processing and operation circuit 22 perform their respective calculation operations during different operation periods.

Moreover, in FIG. 2, the output terminal for outputting the digital output signal is illustrated as a dedicated output terminal, but in order to reduce the number of terminals, the same terminal may be used as the output of the digital processing circuit 12 and also as the output terminal for the digital output signal. Furthermore, the input terminal for inputting the analog input signal may also be used as an input/output terminal for other signals.

Third Embodiment

Figure 3:
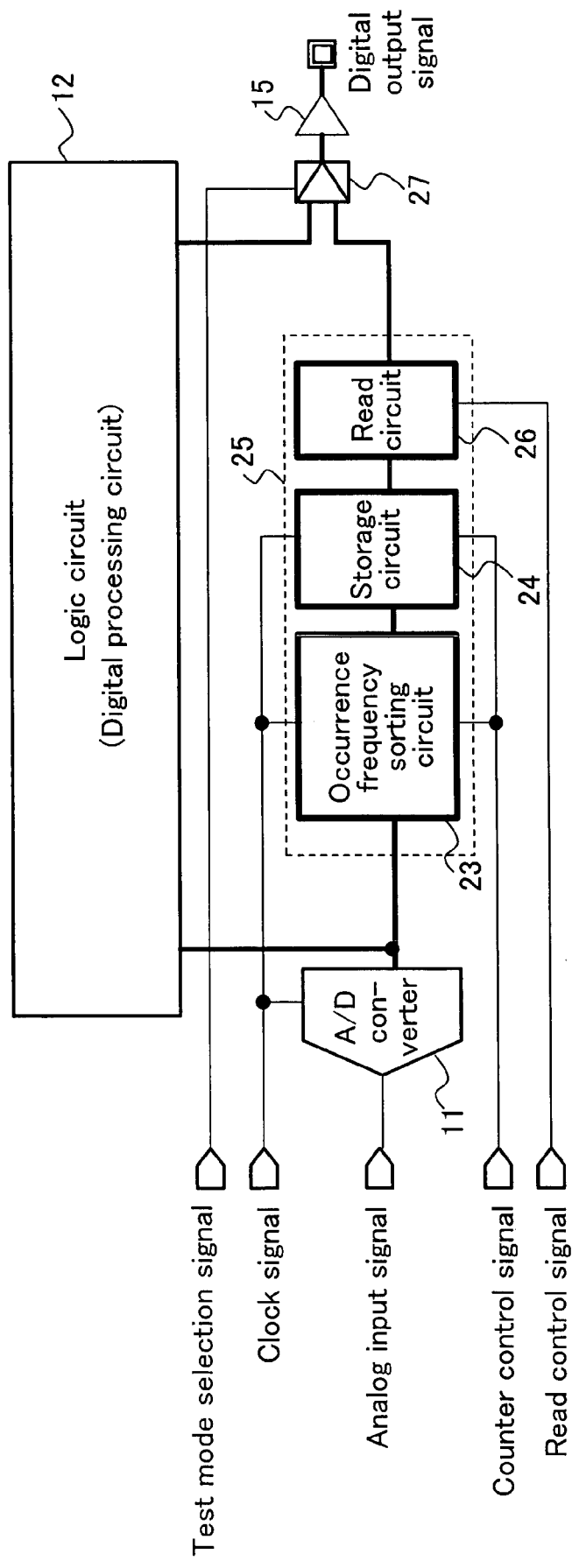
FIG. 3 is a block diagram illustrating the structure of the main part of a semiconductor device according to a third embodiment.

As shown in FIG. 3, a semiconductor device according to a third embodiment includes an A/D converter 11, a digital processing circuit 12, an occurrence frequency counter circuit 25, a selector 27, and a buffer 15. The A/D converter 11 and the digital processing circuit 12 are the same as those in the first embodiment. The occurrence frequency counter circuit 25 includes an occurrence frequency sorting circuit 23, a storage circuit 24, and a read circuit 26.

Occurrence frequencies (histogram) for conversion results obtained by the A/D converter 11, i.e., for the respective output codes of A/D conversions, are stored in the occurrence frequency counter circuit 25. After the completion of a predetermined test process for the A/D converter 11 (for example, in the case of an A/D converter with a resolution of 12 bits, each time an analog input signal, a triangular wave, is input, 20,000 data pieces are captured at regular time intervals, and this is repeated ten times), the occurrence frequency counter circuit 25 outputs digital output signals, indicating the occurrence frequency results, externally of the semiconductor device through the selector 27 and the buffer 15.

In the semiconductor device thus structured, during normal operation, the selector 27 selects the output of the digital processing circuit 12 in accordance with a selection signal. And the results of predetermined processing performed by the digital processing circuit 12 are output externally of the semiconductor device.

On the other hand, during testing on the semiconductor device, for example, a predetermined voltage, as an analog input signal, is applied outside from the semiconductor device, while a test mode selection signal makes the selector 27 select the output of the occurrence frequency counter circuit 25. This allows a test device (not shown) to check the conversion results by using the occurrence frequencies (histogram) for the respective output codes of the A/D conversions stored in the occurrence frequency counter circuit 25.

Details of the operation of the occurrence frequency counter circuit 25 are performed in the following manner.

The result of each conversion made by the A/D converter 11 is input to the occurrence frequency sorting circuit 23. The storage circuit 24 stores the occurrence frequency for each conversion result (output code). The occurrence frequency sorting circuit 23 adds 1 to the occurrence frequency stored in the address in the storage circuit 24 corresponding to the input conversion result (output code). This operation is repeated for a predetermined number of times or within a predetermined length of time. After the completion of the above-described operation, a read control signal causes the data in the storage circuit 24 to be output externally of the semiconductor device through the read circuit 26, the selector 27, and the buffer 15. The occurrence frequency sorting circuit 23 and the storage circuit 24 operate in synchronization with a clock signal that is the operation cycle of the A/D converter 11. The start and end of the operation of the occurrence frequency sorting circuit 23 and of the operation of the storage circuit 24 are controlled by a counter control signal.

Now, the semiconductor device of the third embodiment will be discussed by comparing the semiconductor device with a conventional example (shown in FIG. 22).

Figure 22:
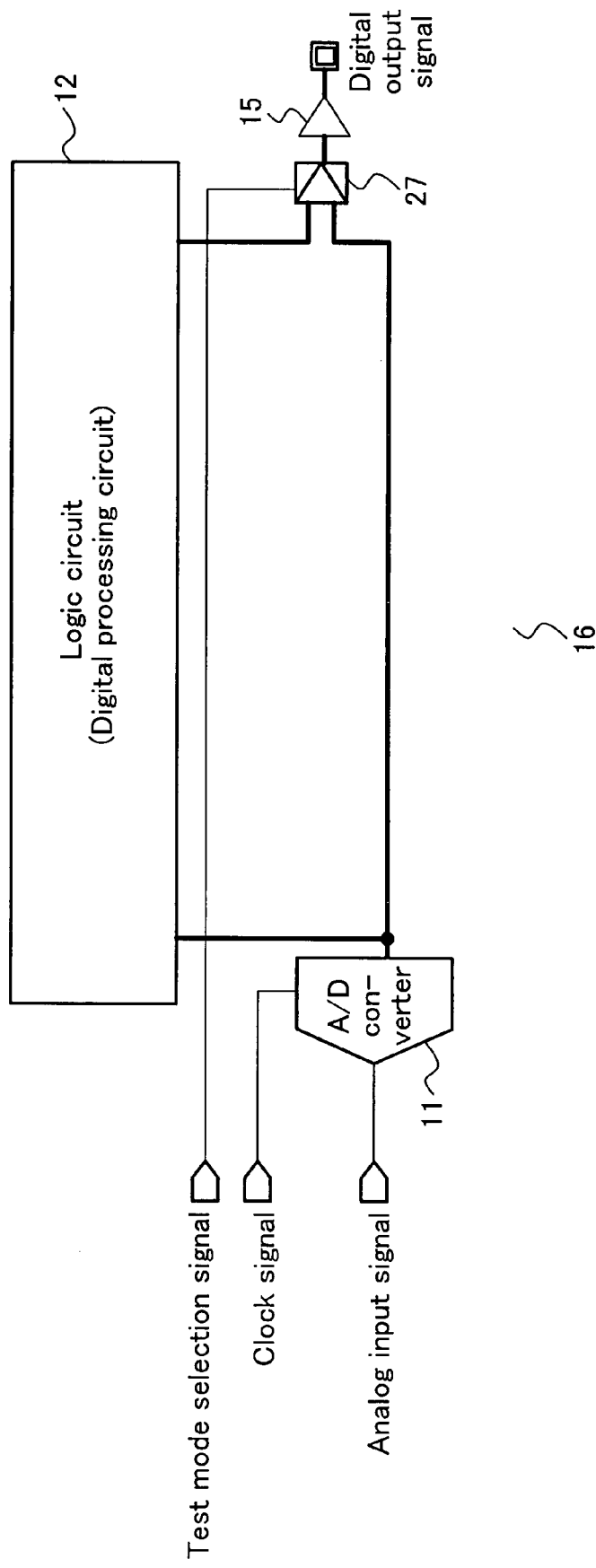
FIG. 22 is a block diagram illustrating the structure of a conventional semiconductor device.

In the conventional example shown in FIG. 22, an A/D converter 11, a digital processing circuit 12, a selector 27, and a buffer 15 are provided. During testing on the semiconductor device shown in FIG. 22, for example, a predetermined voltage, as an analog input signal, is applied outside from the semiconductor device, while a test mode selection signal makes the selector 27 select the output of the A/D converter 11. In this case, in synchronization with a clock signal, a conversion result is output externally of the semiconductor device through the selector 27 and the buffer 15 at every cycle of the A/D conversion, so that a test device (not shown) can check the conversion result. However, due to the driving, by the buffer 15, of a relatively heavy load (e.g., about ten times the capacitance of a different input load in the semiconductor device 16), such as the test device, power supply voltage variation, noise superposition on the A/D converter 11 through parasitic capacitances existing within or outside the semiconductor device 16, etc. are increased relatively as compared with those variation and noise superposition occurring during normal operation.

In contrast to this, in the semiconductor device of the third embodiment shown in FIG. 3, the data on the results output from the A/D converter 11 is temporarily stored in the storage circuit 24, and the stored data is read after the completion of the predetermined test process for the A/D converter 11, thereby preventing noise superposition on the A/D converter 11 and the like.

However, if the number of bits (of the resolution) of the A/D converter 11 is increased (e.g., equal to or higher than about 12 to 14 bits), the amount of conversion results to be stored in the storage circuit 24 and hence the capacitance of the storage circuit 24 become huge, causing a disadvantage in that the time required to read the data into the test device (not shown) and the time required for the test device to perform operations are long.

This disadvantage is caused, because the output results from the A/D converter 11 that completely satisfy data required for a nonlinearity error (INLE) value calculation operation and data required for a differential nonlinearity error (DNLE) value calculation operation are all read into the semiconductor test device, so that all of the operations are performed in the semiconductor test device.

Insofar as the differential nonlinearity error (DNLE) is concerned, the data required for the differential nonlinearity error (DNLE) value calculation is only the occurrence frequencies (histogram) for the respective digital output codes from the A/D converter 11, and the required number of data pieces, when expressed by the number of digital outputs, is $$2^{\text{number of bits (resolution)}} \times \text{maximum occurrence frequency}.$$

Specifically, a test on an A/D converter having a resolution of 14 bits will be described below as an example. In the following example, an average of 128 data pieces is captured for each digital output code of the A/D converter 11.

In the conventional example, a storage capacity of $$2^{14} \times 128 \times 14 = 29360128 \text{ bits (=approximately 29 Mbits)}$$

is required. However, when the occurrence frequency counter circuit 25 is used so that only the data necessary for the differential nonlinearity error (DNLE) calculation is stored, a storage capacity of $$2^{14} \times 10 = 163840 \text{ bits (=approximately 0.2 Mbits,}$$
with the assumption that the maximum occurrence frequency is not more than 1023)

is required. As compared with the conventional example, the necessary storage capacity can be reduced to equal to or less than 0.6%.

As described above, the occurrence frequency counter circuit 25 performs the operation on the A/D conversion results so that only the necessary results are stored and then output externally of the semiconductor device, whereby it becomes possible to avoid a decrease in conversion accuracy caused by the driving of a heavy load, such as the test device, and also significantly reduce the length of time required to read the A/D conversion results into the semiconductor test device and hence the length of time required for operations in the semiconductor test device, because the volume of the data on the A/D conversion results is reduced greatly.

Figure 4:
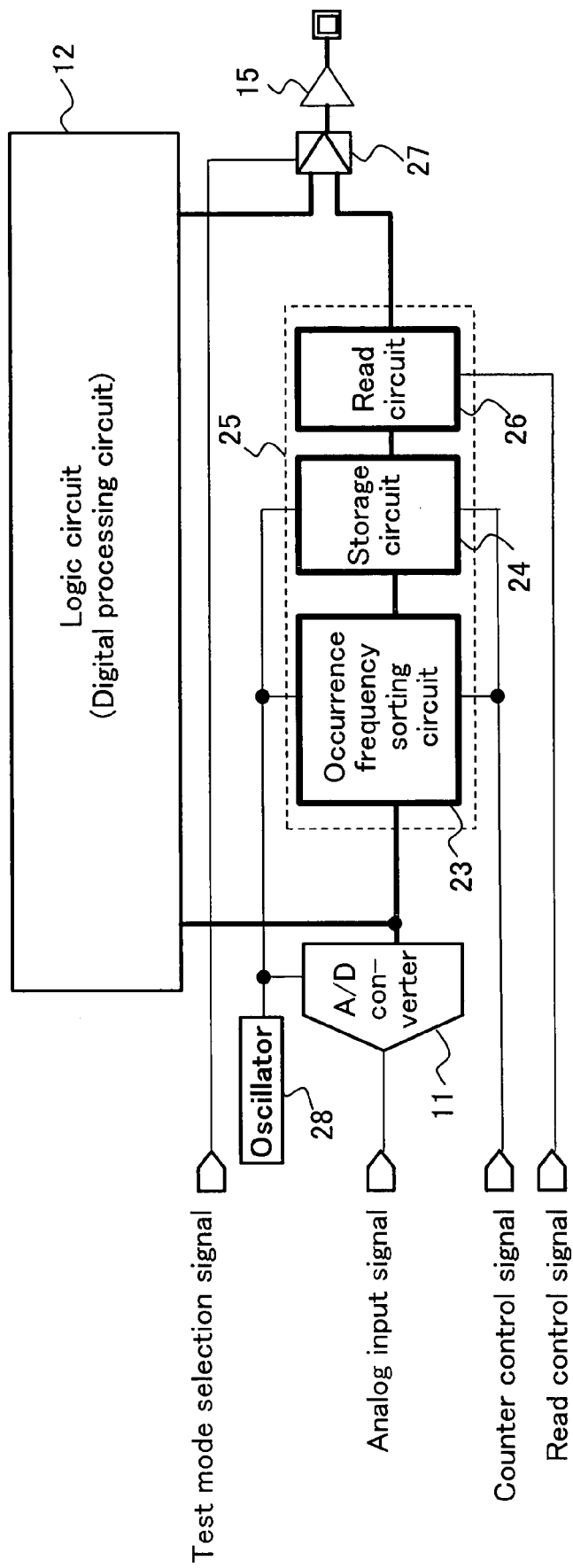
FIG. 4 is a block diagram illustrating a structure for the semiconductor device according to the third embodiment, in which an internal oscillator is used.

As shown in FIG. 4, a signal supplied from an oscillator 28 in the semiconductor device may be used as a clock signal. In that case, there is an advantage in that a higher speed signal can be used as compared with the case in which the external clock signal is supplied. And the A/D converter 11 and the occurrence frequency counter circuit 25 operate in synchronization with each other. When the results are output externally of the semiconductor device, a read signal (e.g., having a cycle lagging behind the cycle of the clock signal) may be used to read the results into the test device (not shown).

Figure 5:
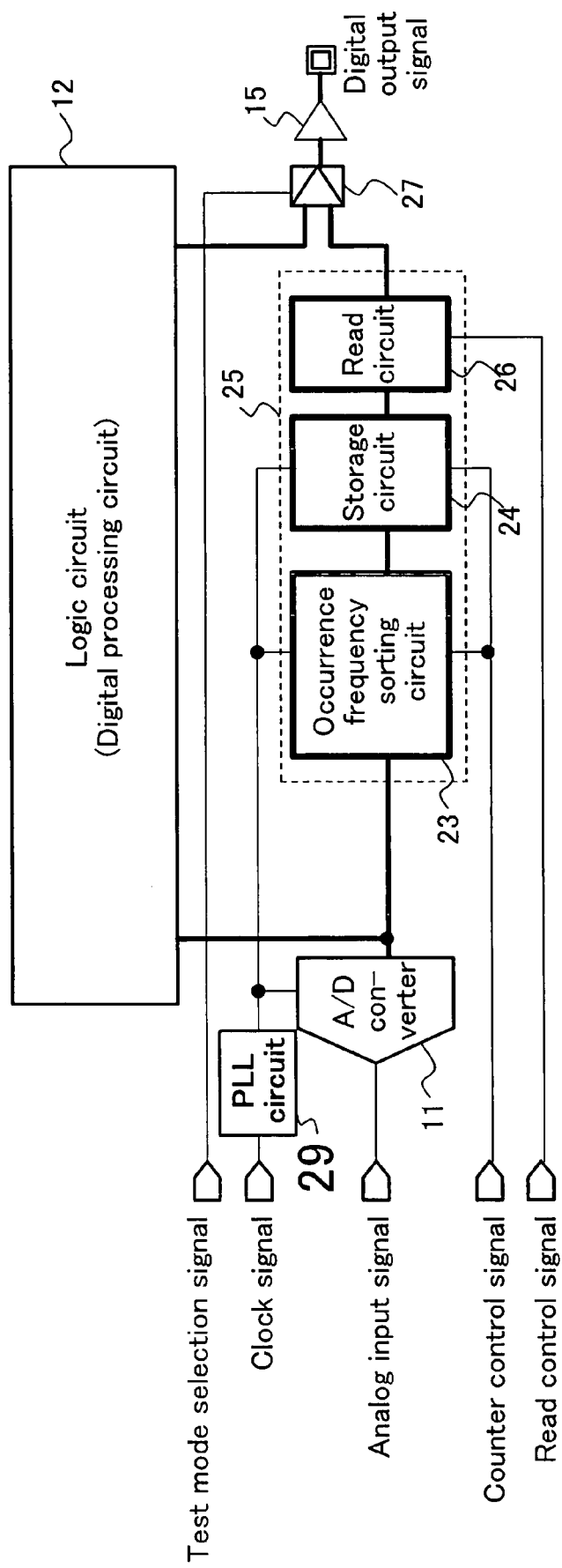
FIG. 5 is a block diagram illustrating a structure for the semiconductor device according to the third embodiment, in which an internal PLL circuit is used.

Also, as shown in FIG. 5, a signal from a PLL circuit 29 in the semiconductor device may be used as a clock signal. In that case, there is an advantage in that a high speed signal obtained by multiplying an externally supplied clock signal can be used. And the A/D converter 11 and the occurrence frequency counter circuit 25 operate in synchronization with each other. When the results are output externally of the semiconductor device, a read signal (e.g., having a cycle lagging behind a cycle obtained by multiplying the clock signal) may be used to read the results into the test device (not shown).

Figure 6:
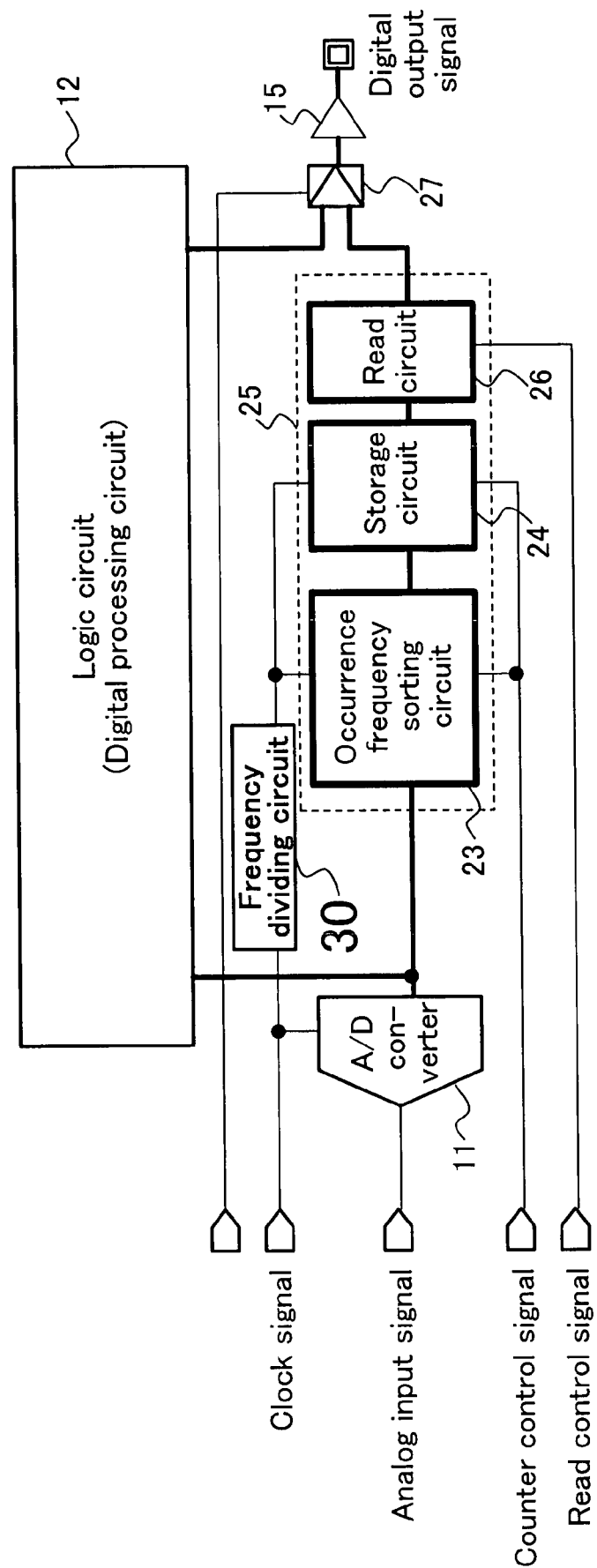
FIG. 6 is a block diagram illustrating a structure for the semiconductor device according to the third embodiment, in which a frequency dividing circuit is used.

Moreover, as shown in FIG. 6, the A/D converter 11 may be operated according to the clock signal, while the occurrence frequency counter circuit 25 may be operated in accordance with a signal that is an integral multiple of the clock signal. In that case, there is an advantage in that the operation speed of the occurrence frequency counter circuit 25 can be kept low, allowing the circuit structure thereof to be simplified. A specific example of the circuitry may have a structure in which the frequency of the 'clock' signal is divided by a frequency dividing circuit 30 and the resultant signal is input to the occurrence frequency counter circuit 25.

Figure 7:
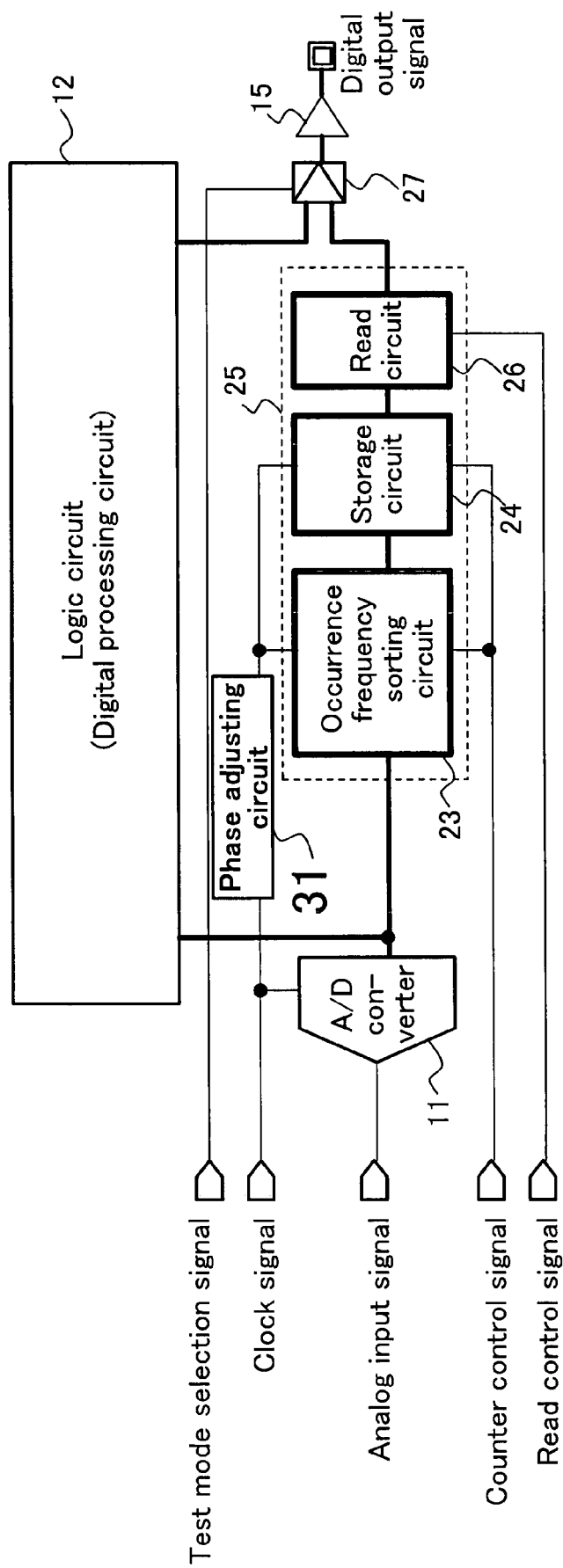
FIG. 7 is a block diagram illustrating a structure for the semiconductor device according to the third embodiment, in which a phase adjusting circuit is used.

Furthermore, as shown in FIG. 7, the A/D converter 11 may be operated according to the clock signal, while the occurrence frequency counter circuit 25 may be operated in accordance with a signal obtained by adjusting the phase of the clock signal. In that case, considering that noise produced in the occurrence frequency counter circuit 25 may adversely affect the A/D converter 11, there is an advantage in that noise production timing, and A/D conversion timing in the A/D converter 11 deviate from each other. A specific example of the circuitry may have a structure in which the phase of the clock signal is adjusted by a phase adjusting circuit 31 and the resultant signal is input to the occurrence frequency counter circuit 25. The circuitry may be structured so that the phase adjustment range of the phase adjusting circuit 31 is freely controllable within or outside from the semiconductor device. Such a structure provides the advantage that the phase adjustment range can be determined based on the result of evaluation of actual measurement of A/D conversion accuracy.

Figure 8:
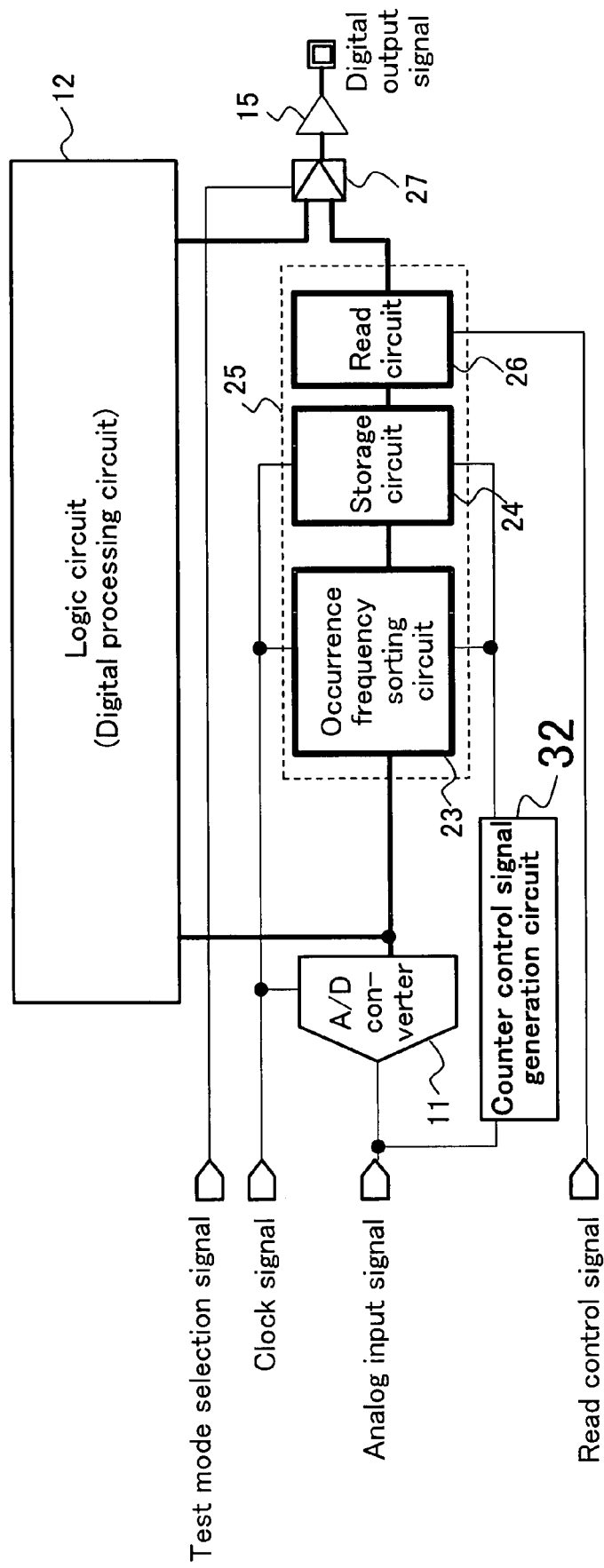
FIG. 8 is a block diagram illustrating a structure for the semiconductor device according to the third embodiment, in which a counter control signal generation circuit is used.

In addition, as shown in FIG. 8, the counter control signal may be generated from a counter control signal generation circuit 32 in the semiconductor device. Then, in a case where an analog input signal, which is a sine wave, a triangular wave, or the like, is input repeatedly multiple times and, during that time, the occurrence frequency counter circuit 25 keeps performing operations on the A/D conversion results and storing the occurrence frequencies at regular time intervals, a certain number of cycles of the analog input signal can be tested easily. Furthermore, since it becomes possible to automatically set the test period by each integral multiple of the analog input signal, variation in the results' occurrence frequencies can be kept small.

In the structures shown in FIGS. 3 to 8, if the output of the A/D conversion results and the output of the digital processing circuit 12 are produced from the same terminal, the number of terminals can be reduced. However, the present invention is not limited to this, but dedicated output terminals may be provided. Furthermore, the input terminal for inputting the analog input signal may also be used as an input/output terminal for other signals.

Fourth Embodiment

Figure 9:
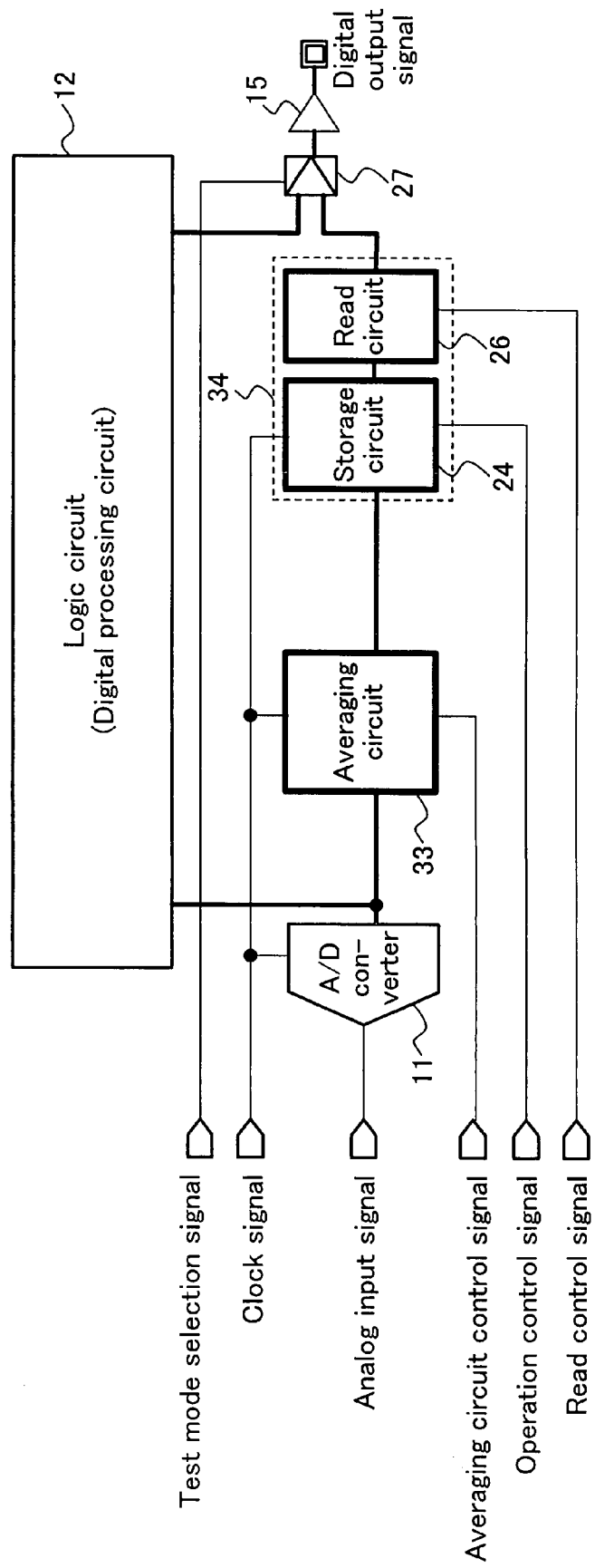
FIG. 9 is a block diagram illustrating the structure of the main part of a semiconductor device according to a fourth embodiment.

As shown in FIG. 9, a semiconductor device according to a fourth embodiment includes an A/D converter 11, a digital processing circuit 12, an averaging circuit 33, an output code storage circuit 34, a selector 27, and a buffer 15.

The A/D converter 11 and the digital processing circuit 12 are the same as those in the first embodiment. The output code storage circuit 34 includes a storage circuit 24 and a read circuit 26. Each conversion result obtained by the A/D converter 11 is input to the averaging circuit 33, and after the A/D converter 11 makes conversions for a predetermined period of time or for a certain number of outputs, the conversion results are sequentially stored in the output code storage circuit 34. After the completion of a predetermined test process for the A/D converter 11, the output code storage circuit 34 outputs the A/D conversion results externally of the semiconductor device through the selector 27 and the buffer 15.

In the semiconductor device thus structured, during normal operation, the selector 27 selects the output of the digital processing circuit 12 in accordance with a test mode selection signal. And the results of predetermined processing performed by the digital processing circuit 12 are output externally of the semiconductor device.

On the other hand, during testing on the semiconductor device, for example, a predetermined voltage, as an analog input signal, is applied outside from the semiconductor device, while the test mode selection signal makes the selector 27 select the output of the output code storage circuit 34. This allows a test device (not shown) to check the A/D conversion results stored in the output code storage circuit 34.

The above-described A/D conversion operation is repeated for a predetermined number of times or within a predetermined period of time.

After the completion of the above-described operation, a read control signal causes the data in the storage circuit 24 to be output externally of the semiconductor device through the read circuit 26, the selector 27, and the buffer 15. The storage circuit 24 in the output code storage circuit 34 operates in synchronization with a clock signal that is the operation cycle of the A/D converter 11. The start and end of the operation of the storage circuit 24 in the output code storage circuit 34 are controlled by an operation control signal.

Now, the semiconductor device of the fourth embodiment will be discussed by comparing the semiconductor device with the conventional example (shown in FIG. 22). The conventional example shown in FIG. 22 is the same as that discussed in the third embodiment.

Unlike in the conventional example shown in FIG. 22, in the semiconductor device of the fourth embodiment shown in FIG. 9, the data on the results output from the A/D converter 11 is temporarily stored in the storage circuit 24, and the stored data is read after the completion of the predetermined test process for the A/D converter 11, whereby power supply voltage variation, and noise superposition on the A/D converter 11 through parasitic capacitances existing within or outside the semiconductor device 16, caused by the driving, by the buffer 15, of a relatively heavy load, such as the test device, are prevented from increasing as compared with those variation and noise superposition occurring during normal operation.

However, if the number of bits (of the resolution) of the A/D converter 11 is increased (e.g., equal to or higher than about 12 to 14 bits), the amount of conversion results to be stored in the storage circuit 24 and hence the capacitance of the storage circuit 24 become huge, causing a disadvantage in that the amount of time required to read the data into the test device (not shown) and the amount of time required for operations in the test device become long. This disadvantage occurs, because the output results from the A/D converter 11 that completely satisfy data required for a nonlinearity error (INLE) value calculation operation and data required for a differential nonlinearity error (DNLE) value calculation are all read into the semiconductor test device, so that all of the operations are performed in the semiconductor test device.

The data required for the nonlinearity error (INLE) is only the digital output results that the A/D converter produces for respective analog input values. If noise components have been removed, the number of data pieces obtained as the number of digital outputs by $$2^{\text{number of bits (of resolution)}} \times \text{number of bits} \times 4$$

is enough to calculate the nonlinearity error (INLE).

Specifically, a test on an A/D converter having a resolution of 14 bits will be described as an example.

A case in which, for noise removal, averaging is performed 128 times for each digital output code from the A/D converter, will be described. In the conventional example, a storage capacity of $2^{14} \times 128 \times 14 = 29360128$ bits (=approximately 29 Mbits)

is required. However, when an operation circuit (the averaging circuit 33 in the example shown in FIG. 9) is used for noise component removal so that only the data necessary for the calculation of a nonlinearity error (INLE) is stored, the required storage capacity is $2^{14} \times 4 \times 14 = 91748$ bits (=approximately 0.92 Mbits).

The necessary storage capacity can be reduced to about 3% as compared with the conventional example.

As described above, the noise components are removed from the A/D conversion results by using the operation circuit (the averaging circuit 33 in the example shown in FIG. 9), so that only the results necessary for the nonlinearity error (INLE) are stored and then output externally of the semiconductor device. This makes it possible to avoid a decrease in conversion accuracy caused by the driving of a heavy load, such as the test device, and also significantly reduce the amount of time required to read the A/D conversion results into the semiconductor test device and hence the amount of time required for operations in the semiconductor test device, because the volume of the data on the A/D conversion results is reduced greatly.

Figure 10:
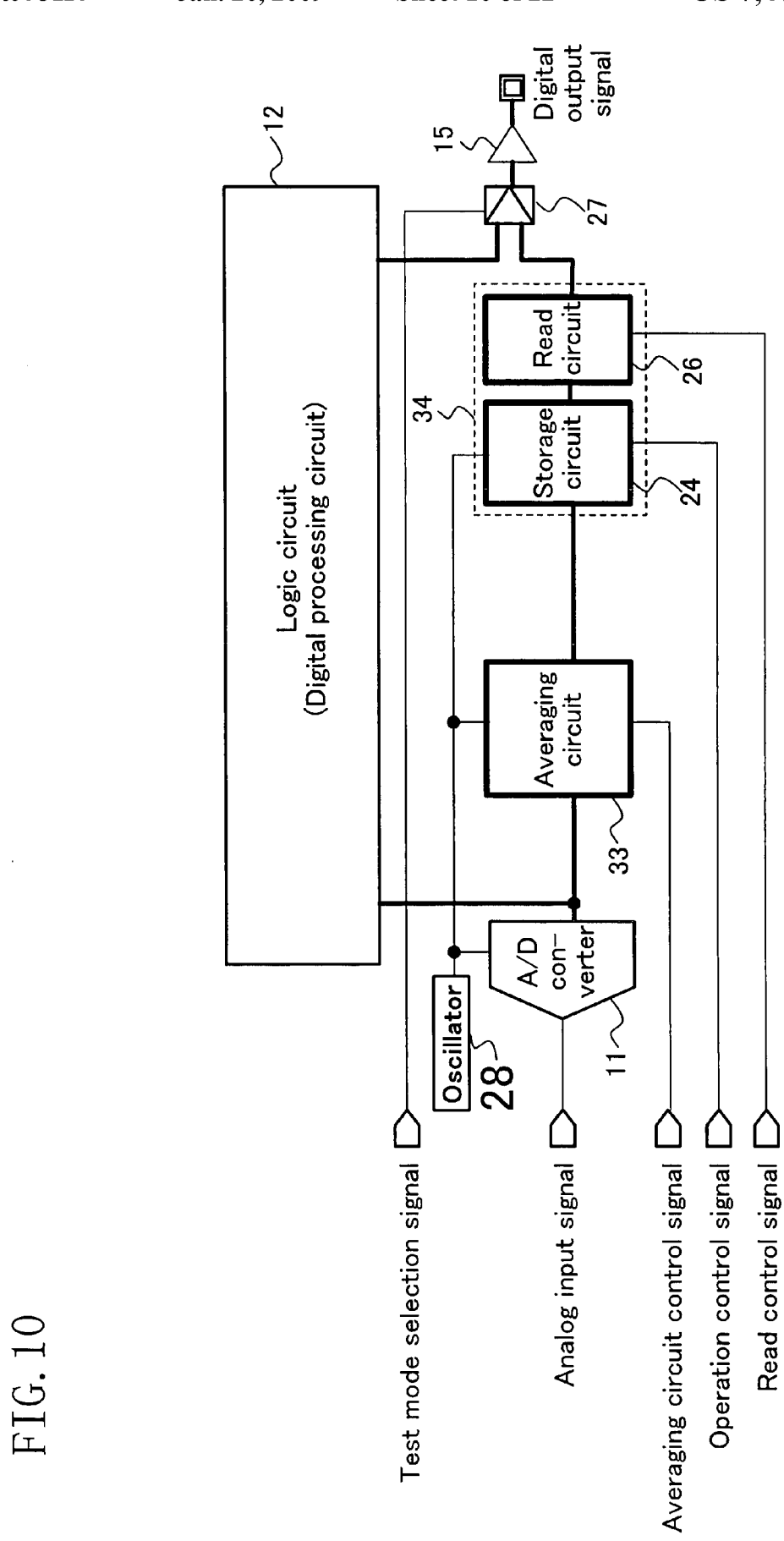
FIG. 10 is a block diagram illustrating a structure for the semiconductor device according to the fourth embodiment, in which an internal oscillator is used.

As shown in FIG. 10, a signal supplied from an oscillator 28 in the semiconductor device may be used as a clock signal. In that case, there is an advantage in that a higher speed signal can be used as compared with the case in which the external clock signal is supplied. And the A/D converter 11, the averaging circuit 33, and the storage circuit 24 in the output code storage circuit 34 operate in synchronization with each other. When the results are output externally of the semiconductor device, the read circuit 26 in the output code storage circuit 34 may operate in accordance with a read signal (e.g., having a cycle lagging behind the cycle of the clock signal) to read the results into the test device (not shown).

Figure 11:
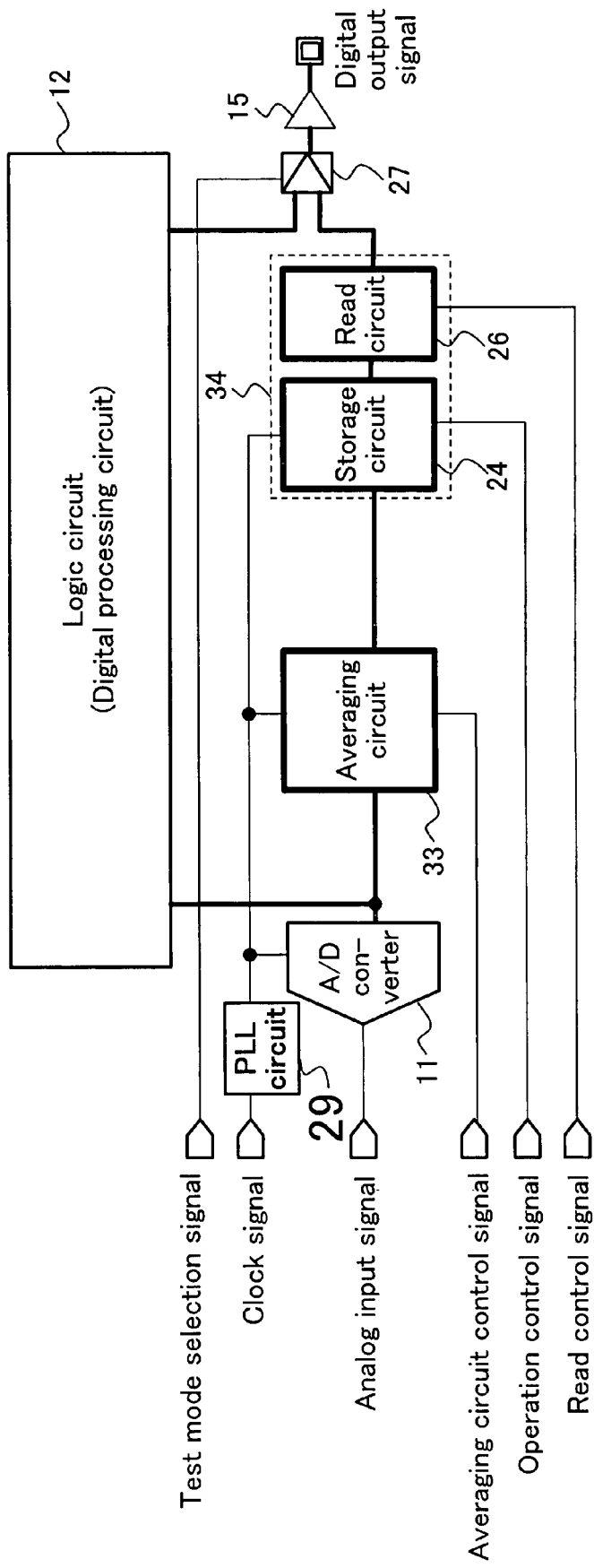
FIG. 11 is a block diagram illustrating a structure for the semiconductor device according to the fourth embodiment, in which an internal PLL circuit is used.

Also, as shown in FIG. 11, a signal from a PLL circuit 29 in the semiconductor device may be used as a clock signal. In that case, there is an advantage in that a high speed signal obtained by multiplying an externally supplied clock signal can be used. And the A/D converter 11, the averaging circuit 33, and the storage circuit 24 in the output code storage circuit 34 operate in synchronization with each other. When the results are output externally of the semiconductor device, the read circuit 26 in the output code storage circuit 34 may operate in accordance with a read signal (e.g., having a cycle lagging behind the cycle of the clock signal) to read the results into the test device (not shown).

Figure 12:
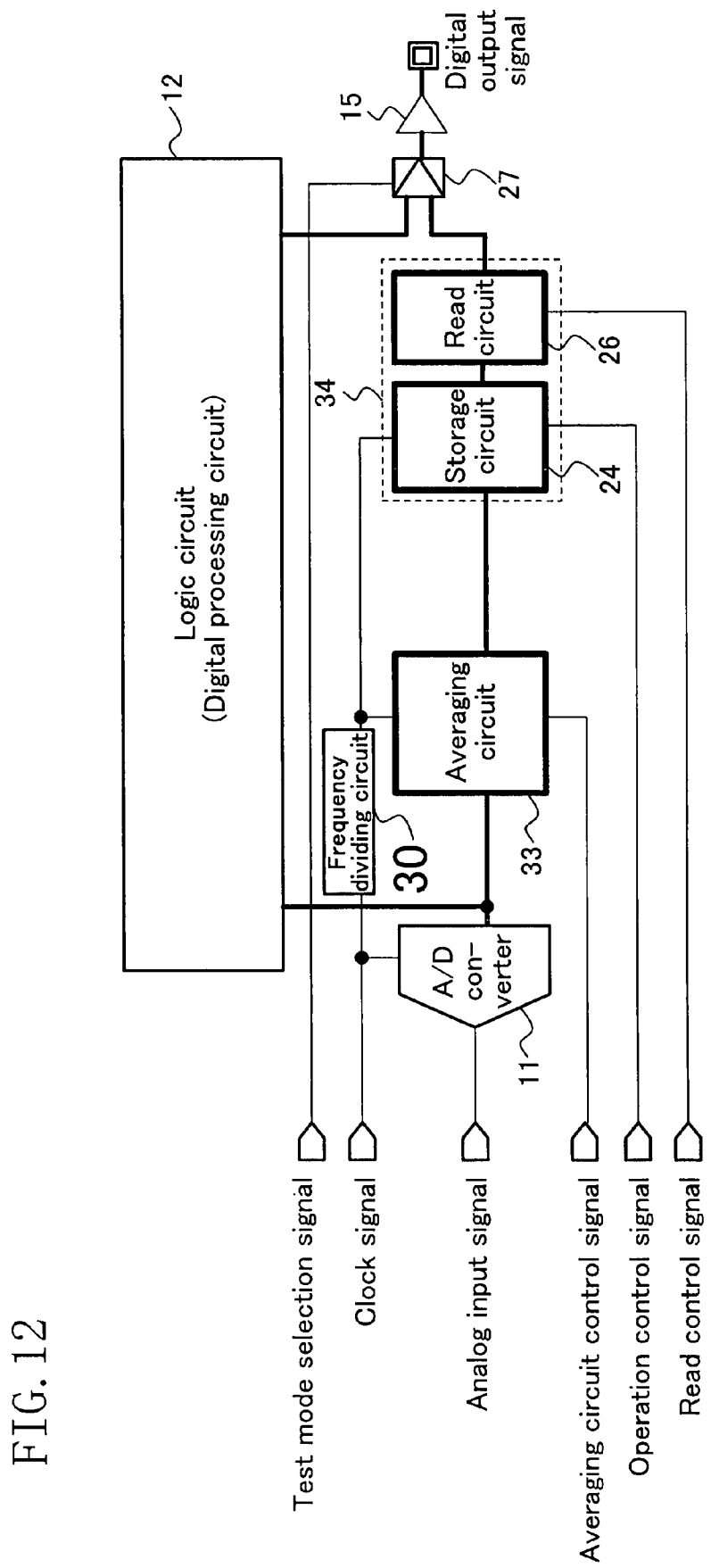
FIG. 12 is a block diagram illustrating a structure for the semiconductor device according to the fourth embodiment, in which a frequency dividing circuit is used.

Moreover, as shown in FIG. 12, the A/D converter 11 may be operated according to the clock signal, while the averaging circuit 33 and the storage circuit 24 in the output code storage circuit 34 may be operated in accordance with a signal that is an integral multiple of the clock signal. In that case, there is an advantage in that the operation speed of the averaging circuit 33 and of the storage circuit 24 in the output code storage circuit 34 can be kept low, allowing the circuit structure of the output code storage circuit 34 to be simplified. A specific example of the circuitry may have a structure in which the frequency of the clock signal is divided by a frequency dividing circuit 30 and the resultant signal is input to the averaging circuit 33 and to the storage circuit 24 in the output code storage circuit 34.

Figure 13:
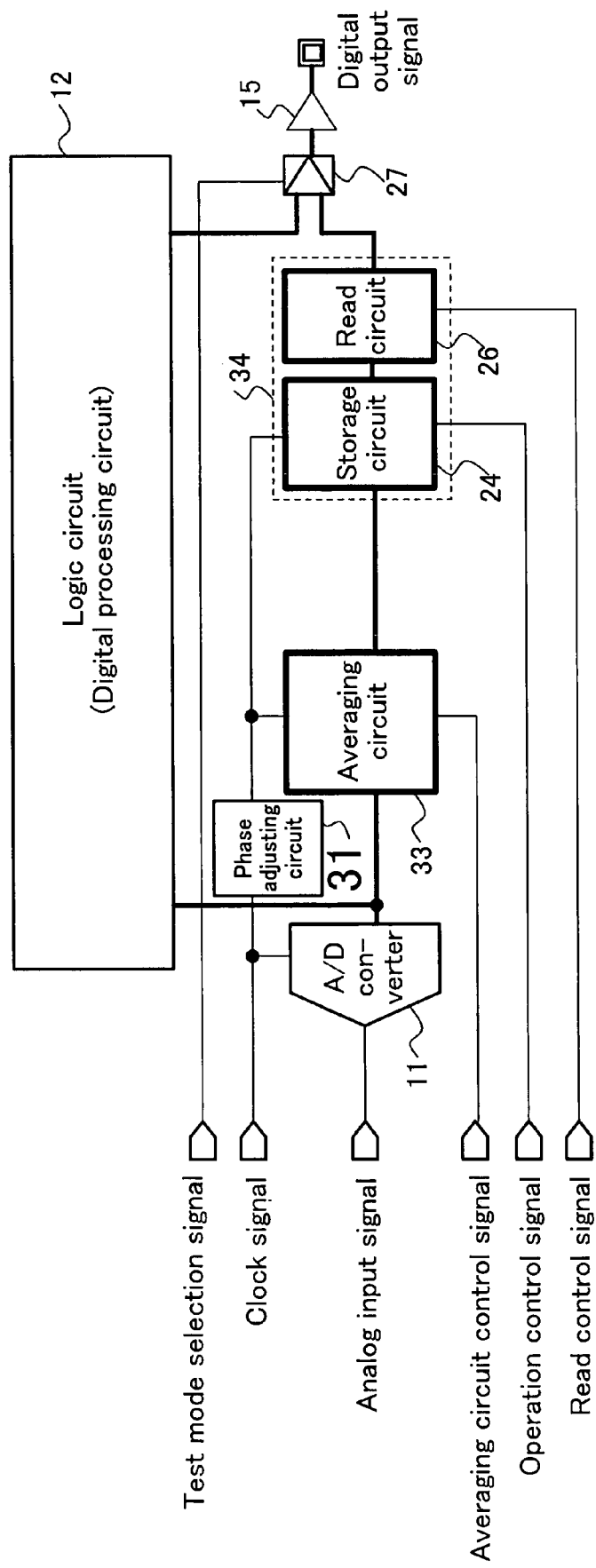
FIG. 13 is a block diagram illustrating a structure for the semiconductor device according to the fourth embodiment, in which a phase adjusting circuit is used.

Furthermore, as shown in FIG. 13, the A/D converter 11 may be operated according to the clock signal, while the averaging circuit 33 and the storage circuit 24 in the output code storage circuit 34 may be operated in accordance with a signal obtained by adjusting the phase of the clock signal. In that case, considering that noise produced in the averaging circuit 33 and in the output code storage circuit 34 may adversely affect the A/D converter 11, there is an advantage in that noise production timing, and A/D conversion timing in the A/D converter 11 deviate from each other. A specific example of the circuitry may have a structure in which the phase of the clock signal is adjusted by a phase adjusting circuit 31 and the resultant signal is input to the averaging circuit 33 and to the output code storage circuit 34. The circuitry may be structured so that the phase adjustment range of the phase adjusting circuit 31 is freely controllable within or outside from the semiconductor device. Such a structure provides the advantage that the phase adjustment range can be determined based on the final result of A/D conversion accuracy.

Figure 14:
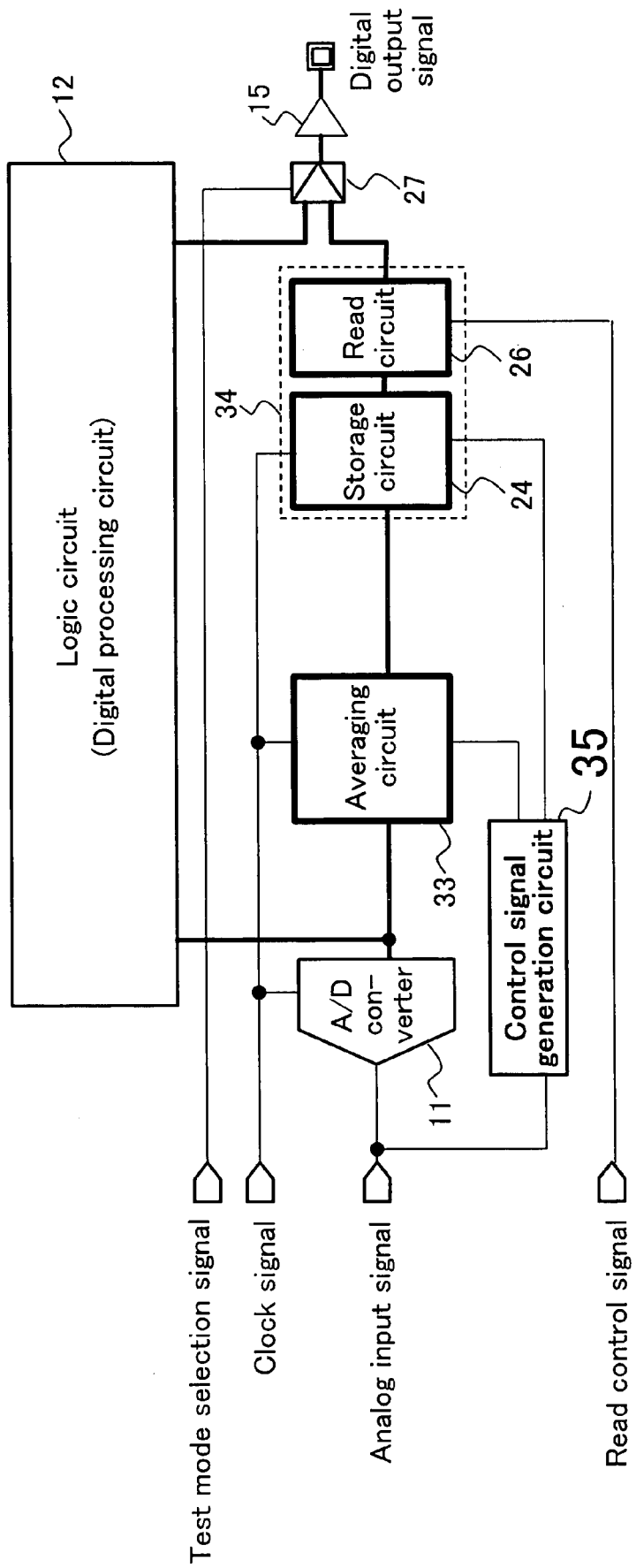
FIG. 14 is a block diagram illustrating a structure for the semiconductor device according to the fourth embodiment, in which a control signal generation circuit is used.

In addition, as shown in FIG. 14, an averaging circuit control signal and the operation control signal may be generated from a control signal generation circuit 35 in the semiconductor device. Then, in a case where an analog input signal, which is a sine wave, a triangular wave, or the like, is input repeatedly multiple times and, during that time, the averaging circuit 33 and the output code storage circuit 34 keep performing operations on the A/D conversion results and storing the operation results at regular time intervals, a certain number of cycles of the analog input signal can be tested easily.

In the structures shown in FIGS. 9 to 14, if the output of the A/D conversion results and the output of the digital processing circuit 12 are produced from the same terminal, the number of terminals can be reduced. However, the present invention is not limited to this, but dedicated output terminals may be provided. Furthermore, the input terminal for inputting the analog input signal may also be used as an input/output terminal for other signals.

Figure 15:
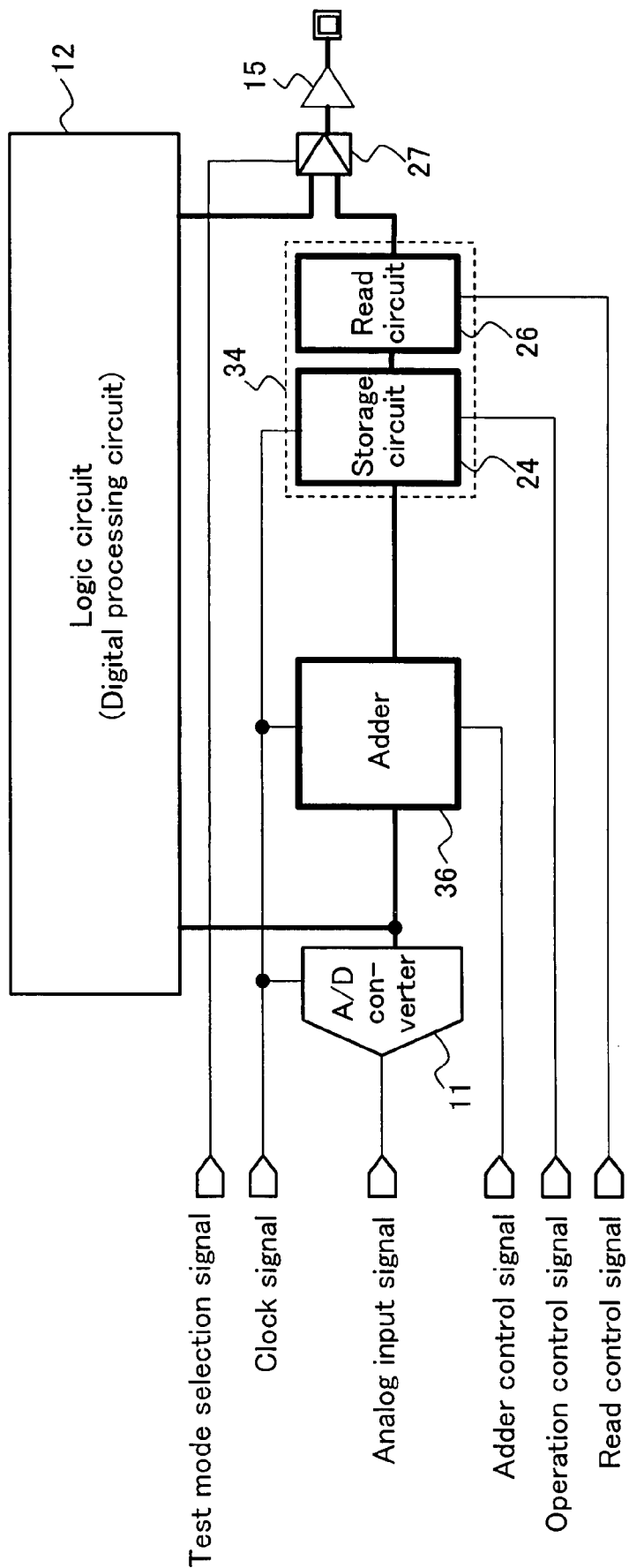
FIG. 15 is a block diagram illustrating a structure for the semiconductor device according to the fourth embodiment, in which an adder is used in place of an averaging circuit.

As shown in FIG. 15, in place of the averaging circuit 33 provided for the purpose of noise component removal, an adder 36 may be used to obtain an output having a larger number of bits than the output of the A/D converter. In that case, the amount of data to be stored increases, but the number of significant figures in the data is increased, thereby providing the advantage that the accuracy is improved.

Figure 16:
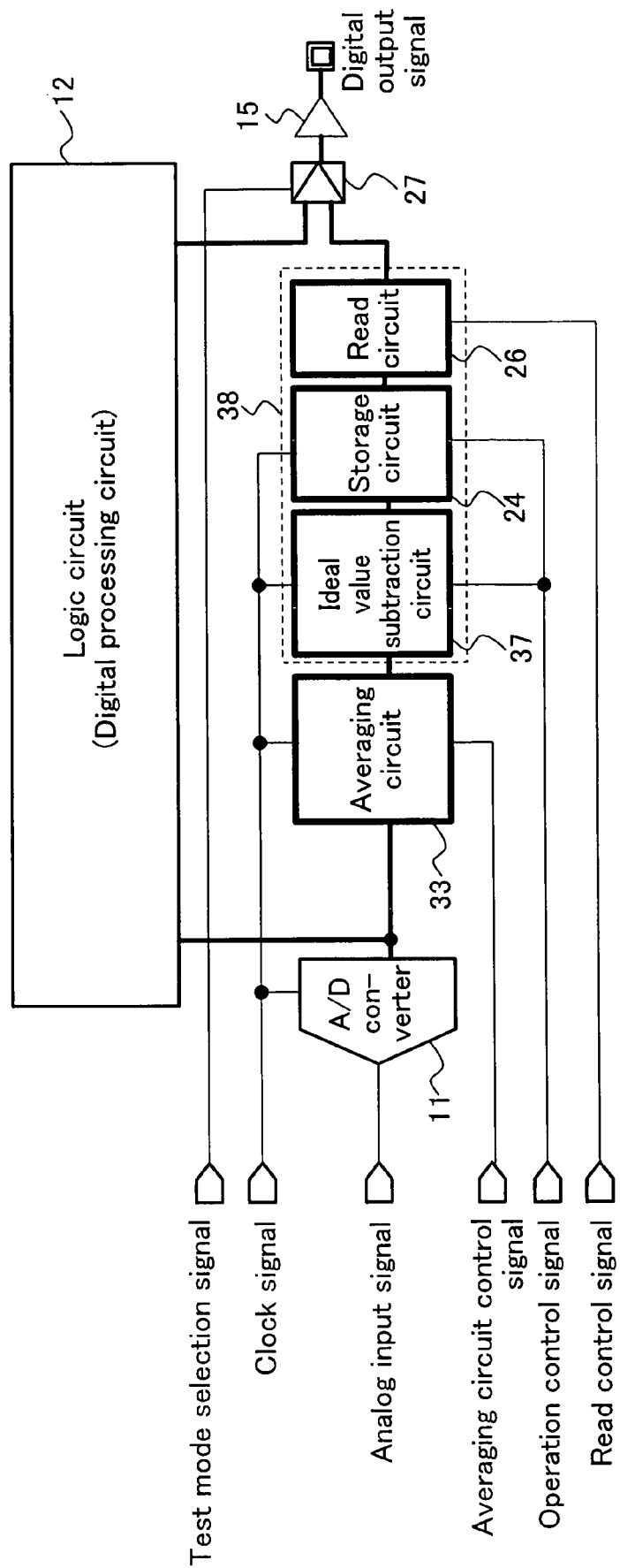
FIG. 16 is a block diagram illustrating a structure for the semiconductor device according to the fourth embodiment, in which an operation storage circuit is used instead of an output code storage circuit.

Also, as shown in FIG. 16, instead of the output code storage circuit 34, an operation storage circuit 38 may be used. The operation storage circuit 38 includes an ideal value subtraction circuit 37, a storage circuit 24, and a read circuit 26. It will be described how the operation storage circuit 38 operates.

In a case where an ideal value for a result output from the averaging circuit 33 is known beforehand, if that ideal value is generated by a storage device or an operation circuit in the internal ideal value subtraction circuit 37 and then is subtracted from the actual output result, the result obtained by this subtraction is only the difference from the ideal value, which provides the advantage that the volume of data to be stored is significantly reduced.

Figure 17:
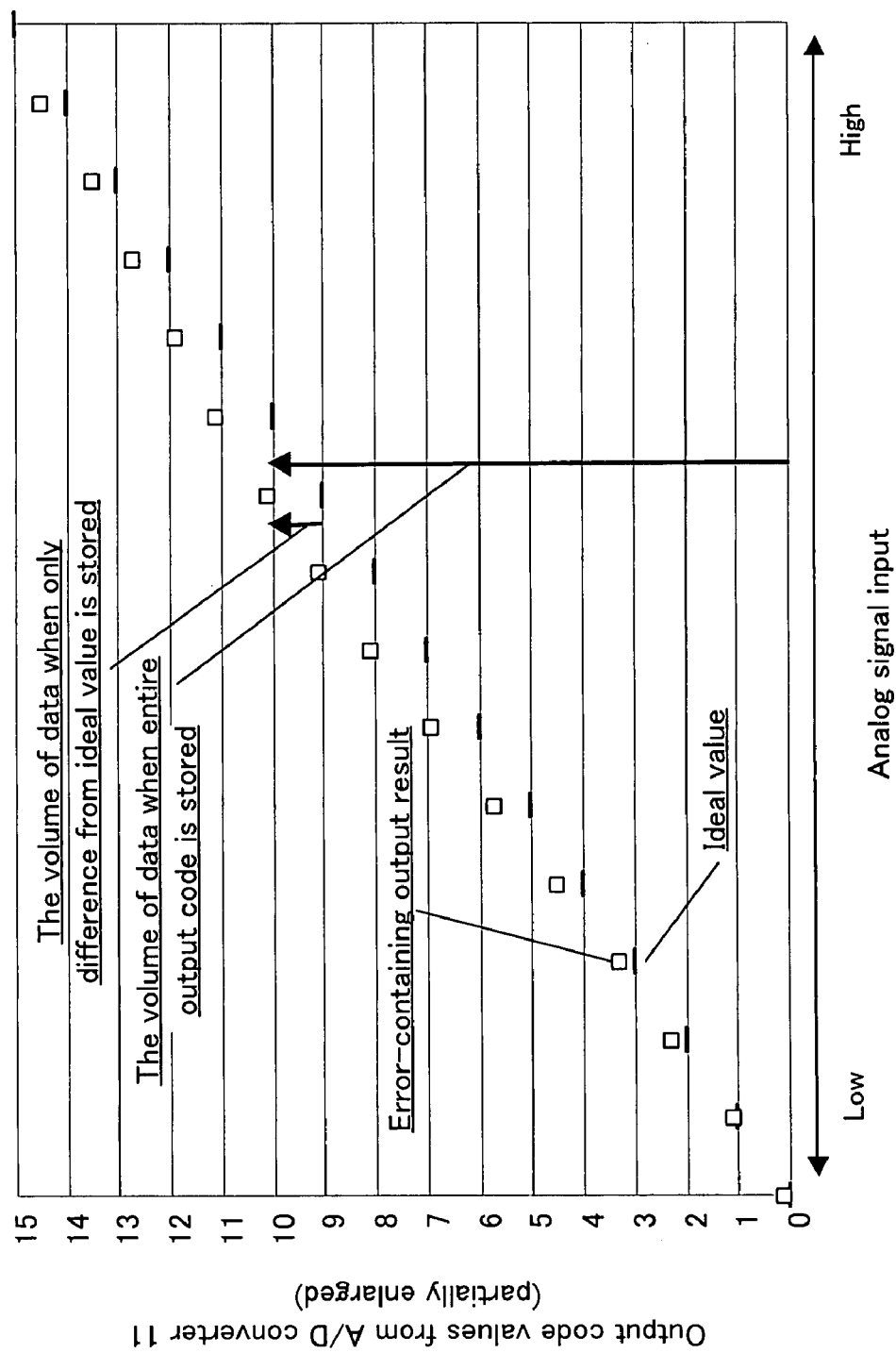
FIG. 17 is an explanatory view showing examples of differences between error-containing output values from an A/D converter and their respective ideal values in the semiconductor device according to the fourth embodiment.

To describe a difference in the volume of stored data between when each output code value produced from the A/D converter 11 is entirely stored and when only the difference between the output code value and the ideal value thereof is stored, FIG. 17 shows exemplary analog signal inputs and exemplary output code values from the A/D converter 11. In FIG. 17, the error-containing output results and their respective ideal values are partially shown in an enlarged scale. When an output code value is entirely stored in the storage circuit 24, the amount of data to be stored is equal to the number of bits of that output code value produced from the A/D converter 11. In the semiconductor device shown in FIG. 16, however, data to be stored in the storage circuit 24 is only the difference from the ideal value (i.e., only the conversion error), and thus the volume of data to be stored is several bits (e.g., about 2 to 5 bits) at most.

Fifth Embodiment

Figure 18:
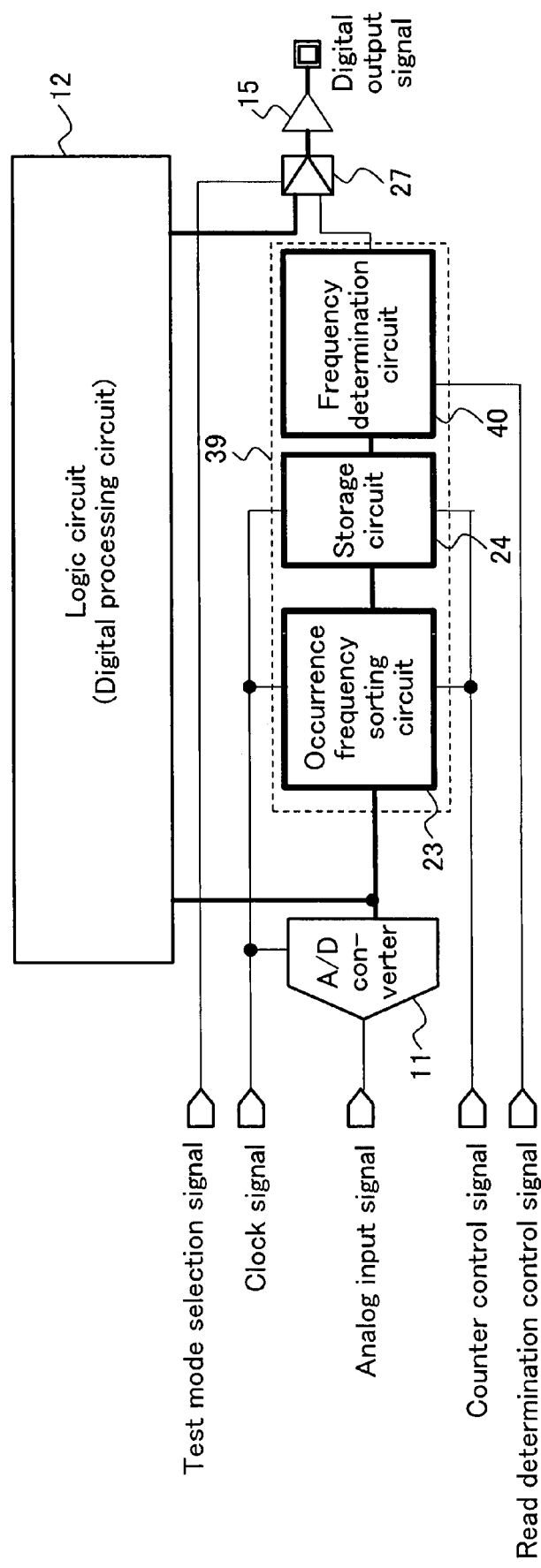
FIG. 18 is a block diagram illustrating the structure of the main part of a semiconductor device according to a fifth embodiment.

As shown in FIG. 18, a semiconductor device according to a fifth embodiment includes an A/D converter 11, a digital processing circuit 12, an occurrence frequency determination circuit 39, a selector 27, and a buffer 15. The A/D converter 11 and the digital processing circuit 12 are the same as those in the first embodiment. The occurrence frequency determination circuit 39 includes an occurrence frequency sorting circuit 23, a storage circuit 24, and a frequency determination circuit 40.

Occurrence frequencies (histogram) for conversion results from the A/D converter 11, i.e., for the respective output codes of A/D conversions, are stored in the occurrence frequency determination circuit 39. After the completion of a predetermined test process for the A/D converter 11 (for example, in the case of an A/D converter with a resolution of 12 bits, each time an analog input signal, a triangular wave, is input, 20,000 data pieces are captured at regular time intervals, and this is repeated ten times), the occurrence frequency determination circuit 39 outputs digital output signals, indicating the occurrence frequency results, externally of the semiconductor device through the selector 27 and the buffer 15.

In the semiconductor device thus structured, during normal operation, the selector 27 selects the output of the digital processing circuit 12 in accordance with a test mode selection signal. And the results of predetermined processing performed by the digital processing circuit 12 are output externally of the semiconductor device.

On the other hand, during testing on the semiconductor device, for example, a predetermined voltage, as an analog input signal, is applied outside from the semiconductor device, while the test mode selection signal makes the selector 27 select the output of the occurrence frequency determination circuit 39. This allows a test device (not shown) to check the result of a determination on the A/D conversions stored in the occurrence frequency determination circuit 39.

Details of the operation of the occurrence frequency determination circuit 39 are performed in the following manner.

The result of each conversion made by the A/D converter 11 is input to the occurrence frequency sorting circuit 23. The storage circuit 24 stores the occurrence frequency for each conversion result (output code). The occurrence frequency sorting circuit 23 adds 1 to the occurrence frequency stored in the address in the storage circuit 24 corresponding to the input conversion result (output code). This operation is repeated for a predetermined number of times or within a predetermined length of time. After the completion of the operation, a read determination control signal makes the frequency determination circuit 40 read the data in the storage circuit 24, determine whether the read value is an occurrence frequency within a predetermined range, and output the determination result externally of the semiconductor device through the selector 27 and the buffer 15.

The occurrence frequency sorting circuit 23 and the storage circuit 24 operate in synchronization with a clock signal that is the operation cycle of the A/D converter 11.

The start and end of the operation of the occurrence frequency sorting circuit 23 and of the operation of the storage circuit 24 are controlled by the read determination control signal.

Figure 19:
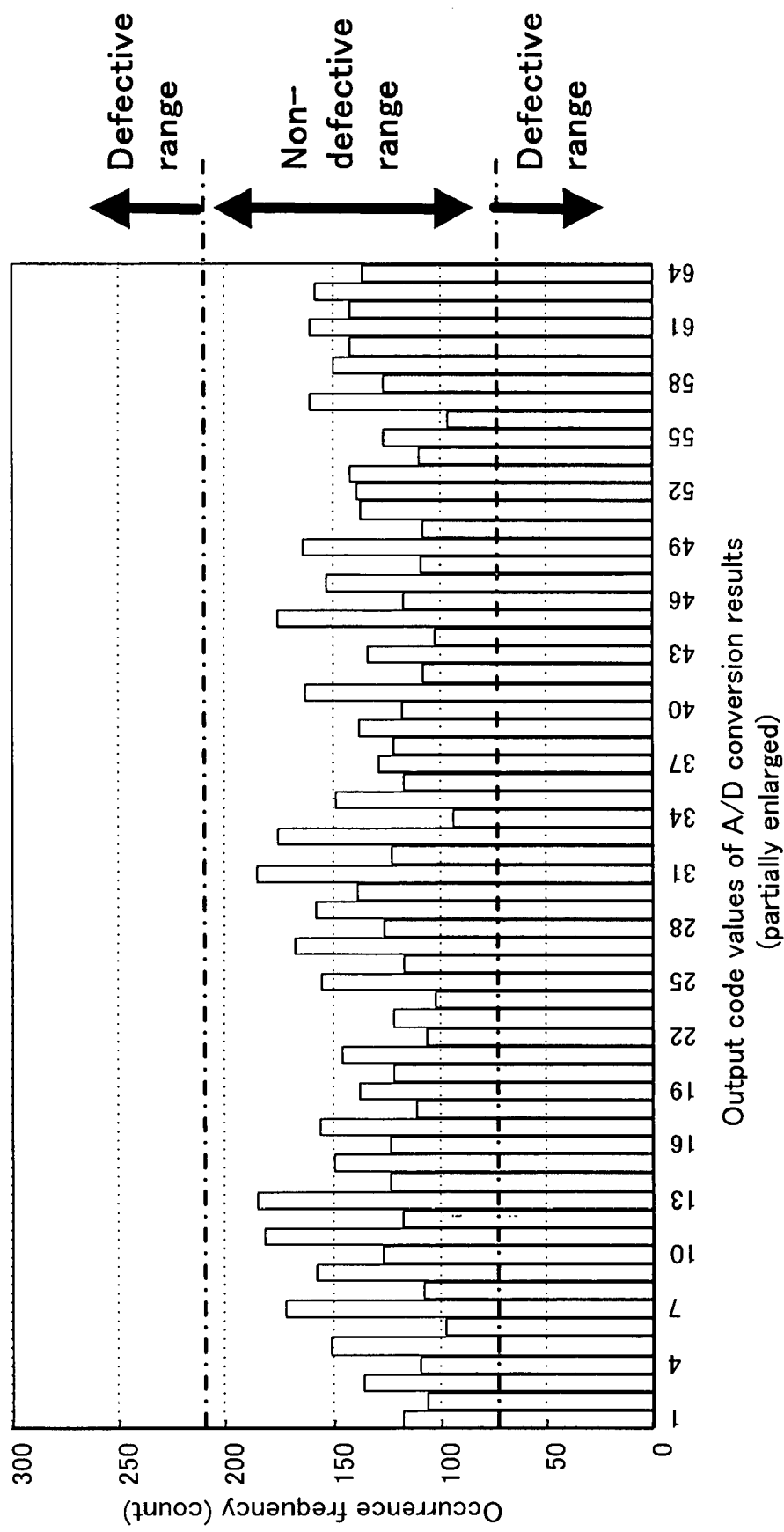
FIG. 19 is an explanatory view showing examples of occurrence frequencies for output results from an A/D converter in the semiconductor device according to the fifth embodiment, and a non-defective range therefor.

FIG. 19 is a graph indicating examples of the output code values of A/D conversion results and examples of occurrence frequencies therefor. If the occurrence frequencies of all of the output codes in FIG. 19 are within a non-defective range, a non-defective determination signal is output. If the occurrence frequency of any of the output codes is within a defective range, a defective determination signal is output.

By this structure, the volume of data output from the semiconductor device to the semiconductor test device is reduced significantly, which is advantageous in reducing the test time.

As in the third embodiment, a signal supplied from an oscillator in the semiconductor device may be used as a clock signal.

Also, as in the third embodiment, a signal from a PLL circuit in the semiconductor device may be used as a clock signal.

Moreover, as in the third embodiment, the A/D converter 11 may be operated according to the clock signal, while the occurrence frequency determination circuit 39 may be operated in accordance with a signal that is an integral multiple of the clock signal. A specific example of the circuitry may have a structure in which the frequency of the clock signal is divided by a frequency dividing circuit and the resultant signal is input to the occurrence frequency determination circuit 39.

Furthermore, as in the third embodiment, the A/D converter 11 may be operated according to the clock signal, while the occurrence frequency determination circuit 39 may be operated in accordance with a signal obtained by adjusting the phase of the clock signal. A specific example of the circuitry may have a structure in which the phase of the clock signal is adjusted by a phase adjusting circuit and the resultant signal is input to the occurrence frequency determination circuit 39.

As in the third embodiment, the circuitry may be structured so that the phase adjustment range of the phase adjusting circuit is freely controllable within or outside from the semiconductor device.

Also, as in the third embodiment, a counter control signal may be generated from a counter control signal generation circuit in the semiconductor device by using the analog input signal.

If the output of the A/D conversion results and the output of the digital processing circuit 12 are produced from the same terminal, the number of terminals can be reduced. However, the present invention is not limited to this, but dedicated output terminals may be provided. Furthermore, the input terminal for inputting the analog input signal may also be used as an input/output terminal for other signals.

Sixth Embodiment

Figure 20:
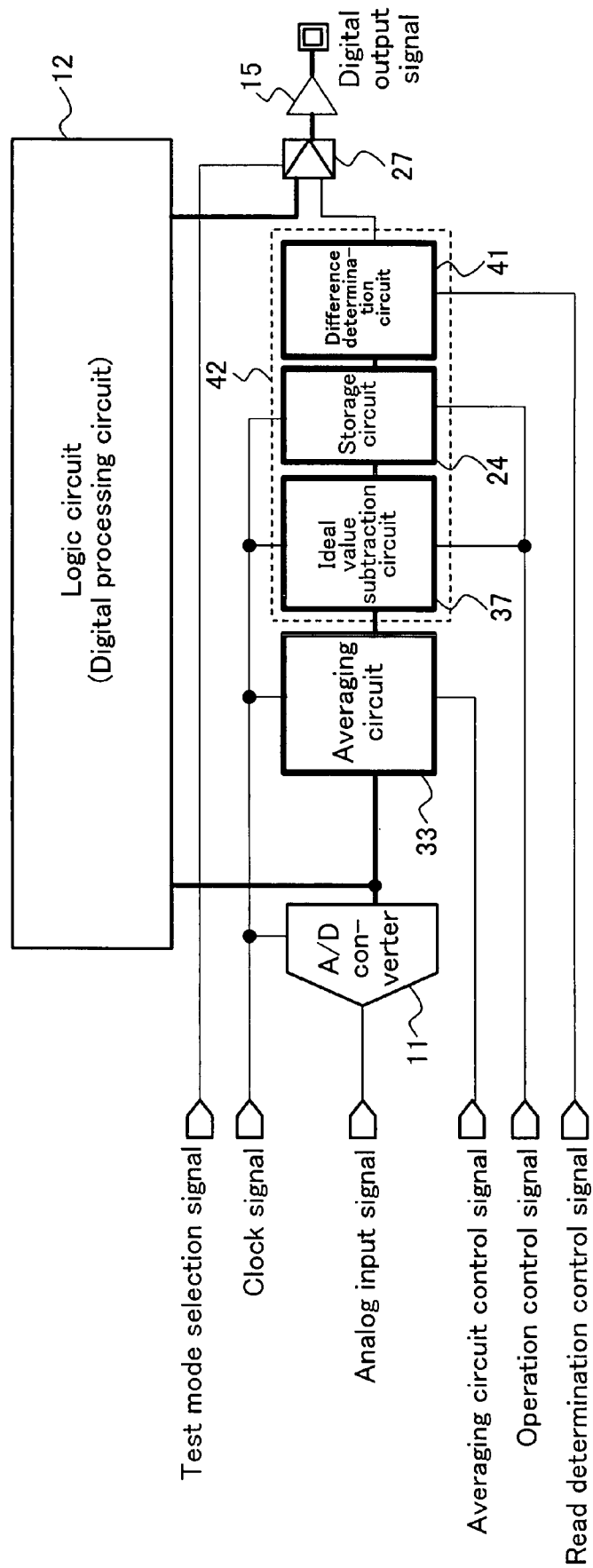
FIG. 20 is a block diagram illustrating the structure of the main part of a semiconductor device according to a sixth embodiment.

As shown in FIG. 20, a semiconductor device according to a sixth embodiment includes an A/D converter 11, a digital processing circuit 12, an averaging circuit 33, an operation determination circuit 42, a selector 27, and a buffer 15. The A/D converter 11 and the digital processing circuit 12 are the same as those in the first embodiment. The operation determination circuit 42 includes an ideal value subtraction circuit 37, a storage circuit 24, and a difference determination circuit 41.

It will be described how the operation determination circuit 42 operates.

Each conversion result from the A/D converter 11 is input to the averaging circuit 33, and the output of the averaging circuit 33 is input to the ideal value subtraction circuit 37, in which the difference between the received output and the ideal value thereof is calculated. The calculated difference is then stored in the storage circuit 24. Each time the A/D converter 11 makes conversions for a predetermined period of time or for a certain number of outputs, the operation described above is carried out.

The difference between the ideal value and the actual A/D conversion result, obtained by the ideal value subtraction circuit 37, indicates the nonlinearity error (INLE) of the A/D converter. In checking the nonlinearity error (INLE), it may be determined whether or not the difference between the ideal value and the actual A/D conversion result is within a predetermined difference range.

After the completion of a predetermined test process for the A/D converter 11, if the differences between the actual A/D conversion results and their respective ideal values are all within the predetermined difference range, the difference determination circuit 41 determines that the A/D converter 11 is non-defective, and if one or more of the data pieces are outside the predetermined difference range, the difference determination circuit 41 determines that the A/D converter 11 is defective.

After the completion of the determination process, only the determination result is output externally of the semiconductor device through the selector 27 and the buffer 15.

The averaging circuit 33, and the ideal value subtraction circuit 37 and the storage circuit 24 in the operation determination circuit 42 operate in synchronization with a clock signal that is the operation cycle of the A/D converter 11. The start and end of the operation of the difference determination circuit 41 in the operation determination circuit 42 are controlled by a read determination control signal.

By this structure, the specific value of each A/D conversion result code is not obtained, but the volume of data output from the semiconductor device to the semiconductor test device is reduced significantly, which is advantageous in reducing the test time.

As in the fourth embodiment, a signal supplied from an oscillator in the semiconductor device may be used as a clock signal.

Also, as in the fourth embodiment, a signal from a PLL circuit in the semiconductor device may be used as a clock signal.

Moreover, as in the fourth embodiment, the A/D converter 11 may be operated according to the clock signal, while the operation determination circuit 42 may be operated in accordance with a signal that is an integral multiple of the clock signal. A specific example of the circuitry may have a structure in which the frequency of the clock signal is divided by a frequency dividing circuit and the resultant signal is input to the operation determination circuit 42.

Furthermore, as in the fourth embodiment, the A/D converter 11 may be operated according to the clock signal, while the operation determination circuit 42 may be operated in accordance with a signal obtained by adjusting the phase of the clock signal. A specific example of the circuitry may have a structure in which the phase of the clock signal is adjusted by a phase adjusting circuit and the resultant signal is input to the operation determination circuit 42.

As in the fourth embodiment, the circuitry may be structured so that the phase adjustment range of the phase adjusting circuit is freely controllable within or outside from the semiconductor device.

Also, as in the fourth embodiment, an operation control signal may be generated from a counter control signal generation circuit in the semiconductor device by using the analog input signal.

If the output of the A/D conversion results and the output of the digital processing circuit 12 are produced from the same terminal, the number of terminals can be reduced.

However, the present invention is not limited to this, but dedicated output terminals may be provided. Furthermore, the input terminal for inputting the analog input signal may also be used as an input/output terminal for other signals.

It should be noted that the operation results obtained by the ideal value subtraction circuit 37 in the operation determination circuit 42 do not have to be temporarily stored in the storage circuit 24, but may be directly input to the difference determination circuit 41 for the determination. This provides the advantage that the number of storage devices included in the semiconductor device can be reduced.

INDUSTRIAL APPLICABILITY

The semiconductor devices according to the present invention are each effective, for example, as a semiconductor device in which the influence of power supply voltage variation and of noise occurring when A/D conversion results are output is avoided to easily perform an appropriate test on the A/D converter, while operation processing on the massive amounts of digital output results that are required for the test on the A/D converter due to the increasing number of bits of the resolution of the A/D converter is efficiently performed in the semiconductor device to reduce the volume of data on the A/D conversion results that is read externally of the semiconductor device and hence the amount of operations performed outside the semiconductor device, thereby easily reducing the test time, i.e., the test costs.

What is claimed is:

1. A semiconductor device comprising:
   an A/D converter;
   a digital processing circuit for performing processing based on conversion results from the A/D converter; and
   a test circuit for checking a differential nonlinearity error (DNLE) of the conversion results from the A/D converter,
   wherein the test circuit includes:
   a storage circuit for storing occurrence repetition for respective digital output values that are the conversion results obtained by the AID converter by making conversions for a predetermined period of time or for a certain number of outputs, and
   a test output terminal for externally outputting data on the occurrence repetition stored in the storage circuit; and
   the test circuit externally outputs the occurrence repetition data stored in the storage circuit, after the conversions made by the A/D converter for the predetermined period of time or for the certain number of outputs are completed.

2. The semiconductor device of claim 1, wherein the test circuit further includes a determination circuit for determining whether the occurrence repetition data stored in the storage circuit is within a predetermined range, and
   the test circuit externally outputs a determination result from the determination circuit, after the conversions made by the A/D converter for the predetermined period of time or for the certain number of outputs are completed.

3. The semiconductor device of claim 1, wherein a cycle, in which the occurrence repetition for the respective digital output values that are the conversion results obtained by the A/D converter by making the conversions for the predetermined period of time or for the certain number of outputs are stored, is the same as a clock cycle of the A/D converter.

4. The semiconductor device of claim 1, further comprising an output signal switching circuit,
wherein the test output terminal is also used as a normal operation output terminal for outputting a predetermined signal during normal operation.

5. The semiconductor device of claim 1, wherein a cycle, in which the occurrence repetition for the respective digital output values that are the conversion results obtained by the A/D converter by making the conversions for the predetermined period of time or for the certain number of outputs are stored, lags behind a clock cycle of the A/D converter and is an integral multiple of the clock cycle of the A/D converter.

6. The semiconductor device of claim 1, wherein an operating clock for the A/D converter and the storage circuit is generated by an oscillator included in the semiconductor device.

7. The semiconductor device of claim 1, wherein an operating clock for the A/D converter and the storage circuit is generated by a PLL circuit in the semiconductor device by multiplying a signal supplied outside from the semiconductor device.

8. The semiconductor device of claim 1, further comprising a phase adjusting circuit for adjusting a phase of a clock cycle of the A/D converter and a phase of a cycle in which the occurrence repetition are stored in the storage circuit.

9. The semiconductor device of claim 1, further comprising a control signal generation circuit for generating, from an analog signal which is an input signal to the A/D converter, one or two or more of control signals including a reset control signal, a start control signal, and a stop control signal for the storage circuit.

10. A semiconductor device comprising:
an A/D converter;
a digital processing circuit for performing processing based on conversion results from the A/D converter; and
a test circuit for checking a nonlinearity error (INLE) of the conversion results from the A/D converter,
wherein the test circuit includes:
an averaging circuit for averaging the conversion results obtained by the A/D converter by making conversions for a predetermined period of time or for a certain number of outputs,
a storage circuit for storing an output result from the averaging circuit, and
a test output terminal for externally outputting data stored in the storage circuit; and
the test circuit externally outputs the data stored in the storage circuit from the test output terminal, after the conversions made by the A/D converter for the predetermined period of time or for the certain number of outputs are completed,
the test circuit further includes an ideal value subtraction circuit for subtracting a predetermined ideal value from the output result from the averaging circuit, and
the storage circuit stores an output from the ideal value subtraction circuit, instead of the output result from the averaging circuit or the output result from the adder.

11. The semiconductor device of claim 10, wherein the test circuit further includes a determination circuit for determining whether the output of the ideal value subtraction circuit stored in the storage circuit is within a predetermined range, and the test circuit externally outputs from the test output terminal a determination result produced by the determination circuit.

12. The semiconductor device of claim 11, wherein the test circuit does not include the storage circuit,
the output of the ideal value subtraction circuit is directly input to the determination circuit, and
the determination circuit determines whether the directly input output of the ideal value subtraction circuit is within the predetermined range.

13. The semiconductor device of claim 10, wherein a cycle, in which the averaging circuit, the storage circuit, and the ideal value subtraction circuit operate, is the same as a clock cycle of the A/D converter.

14. The semiconductor device of claim 10, further comprising an output signal switching circuit,
wherein the test output terminal is also used as a normal operation output terminal for outputting a predetermined signal during normal operation.

15. The semiconductor device of claim 10, wherein a cycle, in which the averaging circuit, the storage circuit, and the ideal value subtraction circuit operate, lags behind a clock cycle of the A/D converter and is an integral multiple of the clock cycle of the A/D converter.

16. The semiconductor device of claim 10, wherein an operating clock for the averaging circuit, the storage circuit, and the ideal value subtraction circuit is generated by an oscillator included in the semiconductor device.

17. The semiconductor device of claim 10, wherein an operating clock for the averaging circuit, the storage circuit, and the ideal value subtraction circuit is generated by a PLL circuit in the semiconductor device by multiplying a signal supplied outside from the semiconductor device.

18. The semiconductor device of claim 10, further comprising a phase adjusting circuit for adjusting a phase of a clock cycle of the A/D converter and a phase of a cycle in which the averaging circuit, the storage circuit, and the ideal value subtraction circuit operate.

19. The semiconductor device of claim 10, further comprising a control signal generation circuit for generating, from an analog signal which is an input signal to the A/D converter, one or two or more of control signals including a reset control signal, a start control signal, and a stop control signal for the averaging circuit and the storage circuit.

20. A semiconductor device comprising:
an A/D converter;
a digital processing circuit for performing processing based on conversion results from the A/D converter; and
a test circuit for checking a nonlinearity error (INLE) of the conversion results from the A/D converter,
wherein the test circuit includes:
an adder for adding the conversion results obtained by the A/D converter by making conversions for a predetermined period of time or for a certain number of outputs,
a storage circuit for storing an output result from the adder, and
a test output terminal for externally outputting data stored in the storage circuit; and
the test circuit externally outputs the data stored in the storage circuit from the test output terminal, after the conversions made by the A/D converter for the predetermined period of time or for the certain number of outputs are completed,
the test circuit further includes an ideal value subtraction circuit for subtracting a predetermined ideal value from the output result from the adder, and the storage circuit stores an output from the ideal value subtraction circuit, instead of the output result from the adder.

21. The semiconductor device of claim 20, wherein the test circuit further includes a determination circuit for determining whether the output of the ideal value subtraction circuit stored in the storage circuit is within a predetermined range, and the test circuit externally outputs from the test output terminal a determination result produced by the determination circuit.

22. The semiconductor device of claim 21, wherein the test circuit does not include the storage circuit, the output of the ideal value subtraction circuit is directly input to the determination circuit, and the determination circuit determines whether the directly input output of the ideal value subtraction circuit is within the predetermined range.

23. The semiconductor device of claim 20, wherein a cycle, in which the adder, the storage circuit, and the ideal value subtraction circuit operate, is the same as a clock cycle of the A/D converter.

24. The semiconductor device of claim 20, further comprising an output signal switching circuit, wherein the test output terminal is also used as a normal operation output terminal for outputting a predetermined signal during normal operation.

25. The semiconductor device of claim 20, wherein a cycle, in which the adder, the storage circuit, and the ideal value subtraction circuit operate, lags behind a clock cycle of the A/D converter and is an integral multiple of the clock cycle of the A/D converter.

26. The semiconductor device of claim 20, wherein an operating clock for the adder, the storage circuit, and the ideal value subtraction circuit is generated by an oscillator included in the semiconductor device.

27. The semiconductor device of claim 20, wherein an operating clock for the adder, the storage circuit, and the ideal value subtraction circuit is generated by a PLL circuit in the semiconductor device by multiplying a signal supplied outside from the semiconductor device.

28. The semiconductor device of claim 20, further comprising a phase adjusting circuit for adjusting a phase of a clock cycle of the A/D converter and a phase of a cycle in which the adder, the storage circuit, and the ideal value subtraction circuit operate.

29. The semiconductor device of claim 20, further comprising a control signal generation circuit for generating, from an analog signal which is an input signal to the A/D converter, one or two or more of control signals including a reset control signal, a start control signal, and a stop control signal for the adder and the storage circuit.

* * * * *